United States Patent
Feldtkeller

(10) Patent No.: US 8,378,695 B2
(45) Date of Patent: Feb. 19, 2013

(54) DETERMINING THE DEAD TIME IN DRIVING A HALF-BRIDGE

(75) Inventor: Martin Feldtkeller, Munich (DE)

(73) Assignee: Infineon Technologies Austria AG, Villach (AT)

( * ) Notice: Subject to any disclaimer, the term of this patent is extended or adjusted under 35 U.S.C. 154(b) by 799 days.

(21) Appl. No.: 12/486,484

(22) Filed: Jun. 17, 2009

(65) Prior Publication Data

US 2010/0321041 A1    Dec. 23, 2010

(51) Int. Cl.
 *G01R 27/26* (2006.01)
(52) U.S. Cl. ............... 324/680; 324/443; 324/207.19; 324/526; 324/610; 324/666
(58) Field of Classification Search .......... 324/443, 324/207.19, 526, 610, 648, 651, 657, 666, 324/673, 680, 706, 725, 98, 101
See application file for complete search history.

(56) References Cited

U.S. PATENT DOCUMENTS

| | | | |
|---|---|---|---|
| 5,973,943 A | 10/1999 | Ribarich et al. | |
| 6,331,755 B1 | 12/2001 | Ribarich et al. | |
| 6,879,115 B2 | 4/2005 | Ribarich | |
| 7,046,049 B2 | 5/2006 | Deppe | |
| 7,279,848 B2 | 10/2007 | Heckmann et al. | |
| 7,449,844 B2 | 11/2008 | Lev et al. | |
| 2006/0034123 A1* | 2/2006 | Feldtkeller et al. | 365/185.21 |
| 2007/0076448 A1* | 4/2007 | Usui | 363/21.01 |
| 2008/0204126 A1* | 8/2008 | Wang et al. | 327/551 |
| 2010/0246231 A1* | 9/2010 | Sirio et al. | 363/132 |

FOREIGN PATENT DOCUMENTS

| | | |
|---|---|---|
| DE | 102004009994 A1 * | 9/2005 |
| DE | 102004037388 A1 | 3/2006 |
| EP | 1155492 B1 | 3/2004 |
| EP | 1275276 B1 | 6/2005 |
| EP | 1277374 B1 | 11/2005 |
| WO | 03059017 A1 | 7/2003 |
| WO | 2005079513 A1 | 9/2005 |

* cited by examiner

*Primary Examiner* — Huy Q Phan
*Assistant Examiner* — Temilade S Rhodes-Vivour
(74) *Attorney, Agent, or Firm* — Dicke, Billig & Czaja, PLLC

(57) ABSTRACT

A circuit arrangement for determining a temporal change of an output voltage of a half-bridge circuit during a dead time. In one embodiment, the circuit arrangement includes a first input for applying the output voltage. A capacitive network is provided having a first and a second circuit node capacitively coupled to the input, and having a terminal for a reference potential. A recharging circuit is configured, during the switched-on phase of one of a first and second switching elements, to adjust electrical potentials of the first and second nodes, the electrical potentials each being different from the reference potential. A comparator arrangement is provided that is configured during the dead time to determine a time difference between such times at which the electrical potentials at the first and second node each assume a given potential value, the time difference being a measure for the change with time of the output voltage.

12 Claims, 11 Drawing Sheets

DETERMINING THE DEAD TIME IN DRIVING A HALF-BRIDGE

TECHNICAL FIELD

The invention relates to a circuit arrangement including a half-bridge circuit, and in one embodiment to determine the dead time between switching off one of the switching elements and switching on the other one of the switching elements of a half-bridge.

BACKGROUND

A half-bridge includes two switching elements each having a drive input and a load path, and having their load paths connected in series with each other between terminals for a positive and a negative supply potential during operation. An output to which a load may be connected to is arranged between the load paths. Using the half-bridge an alternating voltage at the out-put of the half-bridge can be generated from a voltage between the positive and the negative supply potential by alternatingly switching on and switching off the two switches. The two switching elements are driven by two drive signals each of which being provided to the drive input of one of the switching elements. These drive signals may assume an on-level for switching on the corresponding switching element and an off-level for switching off the corresponding switching elements.

There are circuit applications in which the half-bridge is driven in the ZVS mode (ZVS=Zero Voltage Switching). Such circuit applications are, for example, lamp ballasts, in which the load connected to the half-bridge includes a series resonant circuit and a fluorescent lamp (gas discharge lamp). Generally, the load in such ZVS circuits is capable of recharging the output of the half-bridge after switching off the first one of the switching elements and before switching on the second one of the switching elements, namely from the supply potential, to which the first switching element is connected to, to the supply potential, to which the second switching element is connected to. If the second switching element is switched on after recharging the output, than when switching on the second switching element there is no voltage drop across its load path. Therefore, the second switching element can be switched not energized, or at a load path voltage of zero (zero voltage), resulting in a reduction of switching losses. Correspondingly the second switching element can be switched not energized after switching off the second switching element.

The time period between switching off one switch and switching on the other switch is referred to as dead time. This dead time should be adapted to the recharging time of the output: If the dead time is less than the recharging time, then zero-voltage switching is not performed, resulting in increased switching losses; if the dead time is longer than the recharging time, then a current direction of the load current could revert before the end of the dead time, resulting again in an increase of the load path current at the individual switching element. In this case the switching operation would not be not energized, also.

However, the recharging time is dependent on different parameters, such as the load or the applied supply voltage, so that a fixed adjustment of the dead time for driving the half-bridge switching elements is not possible. There is therefore a need to adaptively adjust the dead time during operation of the half-bridge.

For these and other reasons there is a need for the present invention.

SUMMARY

A first embodiment relates to circuit arrangements for determining a variation with time of an output voltage of a half-bridge circuit during a dead time, the half-bridge circuit including two switching elements, each of which alternatingly assuming a switched-on state and a switched-off state, and both assuming a switched-off state during the dead time. This circuit arrangement includes: an input for providing the output voltage; a capacitive network having a first and a second circuit node each of which being capacitively coupled to the input, and having a terminal for a reference potential; a recharging circuit for the capacitive network adapted to adjust during the switched-on phase of the at least one switching element electrical potentials at the first and the second circuit nodes that are different from the reference potential; a comparator arrangement adapted to determine during the dead time a time difference between those times at which the electrical potentials at the first and the second nodes each assume a given potential value. This time difference is a measure for the variation of the output voltage with time.

A second embodiment relates to a control circuit for a half-bridge circuit having a first and a second switching element and having an output. This control circuit includes: a drive signal generation circuit adapted to generate a first drive signal for the first switching element and a second drive signal for the second switching element dependent on a dead time signal; and a dead time signal generation circuit for generating the dead time signal. The dead time signal generation circuit includes: an input adapted to be coupled to the output of the half-bridge circuit; a capacitive network having a first and a second circuit node each being capacitively coupled to the input, and having a terminal for a reference potential; a recharging circuit for the capacitive network adapted to adjust during the switched-on phase of the at least one switching element electrical potentials at the first and the second circuit node that are different from the reference potential; a comparator arrangement adapted to determine during the dead time a time difference between those times at which the electrical potentials at the first and the second nodes each assume a given potential value, and to generate the dead time signal dependent on this time difference.

A third embodiment relates to a method for determining a variation with time of an output voltage of a half-bridge circuit during a dead time, the half-bridge circuit including two switching elements each alternatingly assuming a switched-on state and a switched-off state, and both assuming a switched-off state during the dead time. The method includes: providing a capacitive network having an input receiving the output voltage, and having a first and a second circuit node each being capacitively coupled to the input; recharging the first and second circuit nodes during the switched-on phase of the at least one switching element in such a manner that electrical potential settle in at the first and the second circuit nodes that are different from the reference potential; during the dead time: determining a time difference between those times at which the electrical potentials at the first and the second nodes each assume a given potential value, this time difference being a measure for the variation of the output voltage with time.

BRIEF DESCRIPTION OF THE DRAWINGS

In the following examples will be explained with reference to drawings. These drawings serve to explain the basic principle, so that only those features relevant for understanding the basic principle are illustrated in the drawings. In the drawings, unless stated otherwise, same reference symbols denote same features with the same meaning

DETAILED DESCRIPTION OF THE DRAWINGS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
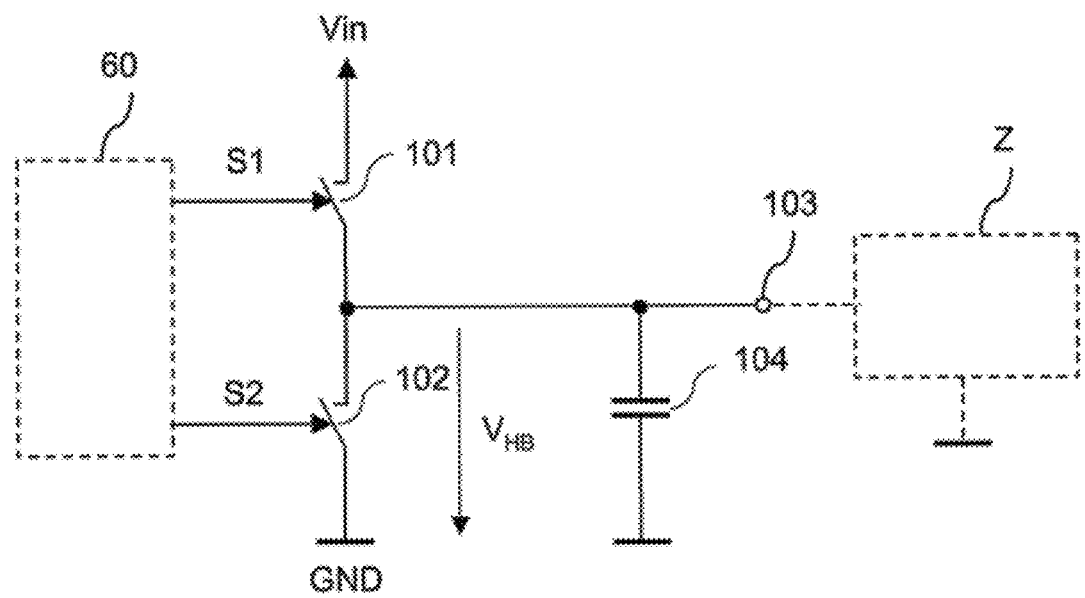
FIG. 1 illustrates by way of a block diagram the basic configuration of a half-bridge circuit.

FIG. 1 schematically illustrates one embodiment of a half-bridge circuit having a half-bridge that includes two switching elements, namely a first switching element 101 and a second switching element 102, each having a load path and a drive input. The load paths of the two switching elements 101, 102 are connected in series with each other between terminals for a first supply potential Vin and a second supply potential GND. The first supply potential Vin is, for example, a positive supply potential, the second supply potential GND is, for example, a negative supply potential or a reference potential, such as ground. The half-bridge further includes an output 103 that is arranged between the load paths 101, 102 of the switching elements, and that, in the example as illustrated, is formed by a node common to the load paths 101, 102. In this connection it should be mentioned that between the load paths of the two switching elements 101, 102 additional elements, such as a measurement resistor (not illustrated), could be arranged.

The first switching element 101, that is connected between the terminal for the first supply potential Vin and the output 103, will be referred to as upper switching element or high-side switch of the half-bridge in the following, and the second switching element 102, that is connected between the output 103 and the second reference potential GND, will be referred to as lower switching element or low-side switching element of the half-bridge in the following. The switching elements 101, 102 are driven to be conducting or blocking, or switched-on or off, respectively, dependent on drive signals S1, S2 that are provided to their drive inputs. In FIG. 1 reference symbol S1 denotes a first drive signal that is provided to the drive input of the first switching element 101, and reference symbol S2 denotes a second drive signal that is provided to the drive input of the second switching element 102.

Switching elements 101, 102 can be any switching elements that are adapted to be switched-on and off by electrical drive signals, such as drive signals S1, S2. Such switching elements are in one embodiment semiconductor switching elements. Examples for suitable semiconductor switching elements 101 102 for use in the half-bridge are MOSFET, in one embodiment power MOSFET, or IGBT, in one embodiment power IGBT. MOSFET or IGBT each include a drain-source-path (which is also referred to as collector-emitter path in an IGBT) that form their load paths, and each include a gate terminal that forms a drive input. Controlling MOSFET or IGBT is performed by applying suitable gate-source voltages. Thus, drive signals for driving MOSFET or IGBT are their gate-source voltages.

For purpose of the following explanation it may be assumed that a switching element 101, 102 of the half-bridge is conducting, if its control signal S1, S2 assumes an on-level, and that the switching element 101, 102 is blocking, if its control signal S1, S2 assumes an off-level. The on-level for switching on the switching element and the off-level for switching off the switching element, respectively, is dependent on the type of the switching element that is used. In re-channel MOSFET or n-channel IGBT the on-level is a positive gate-source voltage, while in p-channel MOSFET or in p-channel IGBT the on-level is a negative gate-source voltage. Only for illustration purposes it is assumed in connection with the following explanation that on-levels of the control signals S1, S2 are upper signal levels or "high" levels, respectively, of the control signals and that off-levels of the control signals are lower signal levels or "low" levels of the control signals.

In FIG. 1 reference symbol 60 denotes a drive circuit that generates drive signals S1, S2 (illustrated in dashed lines). Reference symbol Z denotes a load (also illustrated in dashed lines) that is connected to the output 103 of the half-bridge, and that is driven by an output voltage $V_{HB}$ of the half-bridge. Via the switching elements 101, 102 of the half-bridge the output 103 can either be connected to the first supply potential Vin, or to the second supply potential GND. If on-resistances of the switching elements 101, 102 are neglected, then the maximum amplitude of the output voltage $V_{HB}$ equals the supply voltage present between the terminals for the first and the second supply potential. With the first switching element 101 switched on and the second switching element 102 switch off the output voltage $V_{HB}$ is approximately equivalent to the supply voltage; with the second switching element 102 switched on and the first switching element 101 switched off the output voltage is approximately zero.

A half-bridge, such as a half-bridge illustrated in FIG. 1, is, for example, used for driving loads that as an input voltage or supply voltage, respectively, require a voltage that oscillates between the upper and the lower supply potential with time. Such loads are, for example, inductive loads, such as electric motors or magnetic valves, or lamp circuits for fluorescent lamps. Such lamp circuits may include a series resonance circuit having a resonance capacitor and a resonance inductance, and a fluorescent lamp connected in parallel with the resonance capacitor, and therefore being in series to the resonance inductance. For providing such oscillating output voltage $V_{HB}$ each of the switching elements 101, 102 is alternatingly switched on and off in a commonly known manner, i.e., assumes alternatingly a switched-on or switched-off state over time. The switched-on and switched-off phases of the two switching elements 101, 102 are phase-shifted in such a way that at one time only one of the switching elements 101, 102 is switched-on and that between switching off one of the switching elements and switching on the other one of the switching elements there is a dead time for which both switching elements 101, 102 are switched-off.

Figure 2:
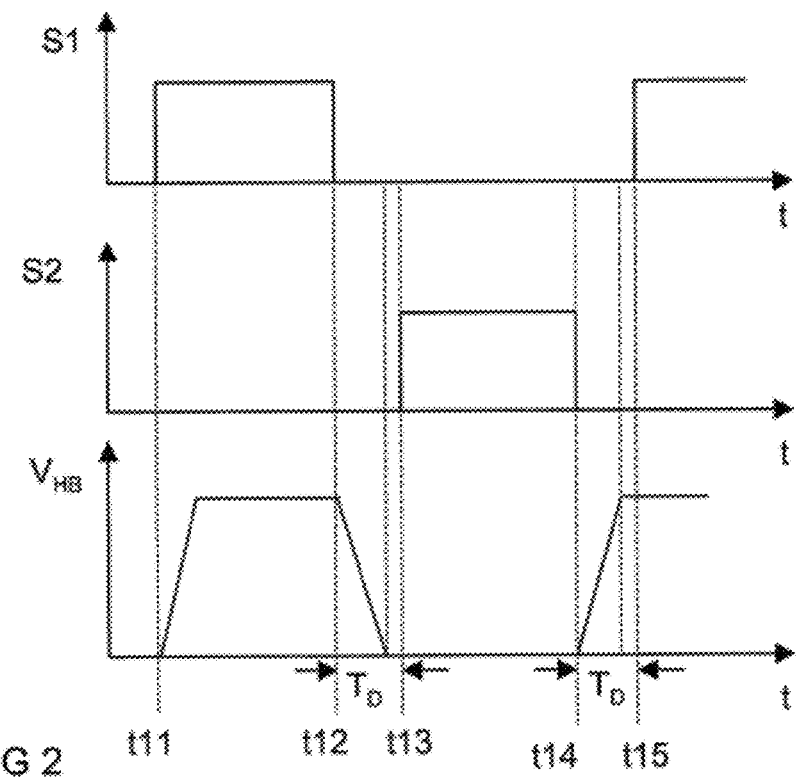
FIG. 2 illustrates the operating principle of a half-bridge operated in zero-voltage-switching mode (ZVS mode).

This mode of controlling the two switching elements 101, 102 is illustrated in FIG. 2 by way of timing diagrams of the first and second control signals S1, S2. In FIG. 2 t11 denotes a time at which the first drive signal S1 assumes an on-level, and t12 denotes a time at which this first drive signal S1 assumes an off-level. During this time period t11-t12 the second drive signal S2 has an off-level and keeps this level also for a dead time $T_D$ after switching off the first switching element 101 until the second switching element 102 is switched on at time t13. At a time t14 the second switching element 102 is switched off, and the first switching element 101 is switched on again not until after expiration of a dead time $T_D$ after switching off the second switching element 102, which is at a later time t15.

In FIG. 2 a timing diagram of the output voltage $V_{HB}$ dependent on the drive signals S1, S2 for a zero-voltage-switching mode (ZVS mode) is also illustrated. In this mode of operation a voltage change of the output voltage $V_{HB}$ during the dead time $T_D$ is initiated by the load Z in such a manner that the voltage across the switching element that is to be switched on next becomes zero during the dead time. This means, referring to the example illustrated in FIG. 2, that during the dead time between the times t12 and t13—i.e., after switching off the first switching element 102—the output voltage $V_{HB}$ decreases from the upper voltage level or the value of the supply voltage, respectively, to the lower voltage level or zero, respectively. During the dead time between the times t14 and t15—i.e., after switching off the second switching element 102—the voltage increases from the lower voltage level to the upper voltage level. An example of a load Z that allows such ZVS operation is a lamp circuit (not illustrated) having a series circuit with a resonance inductance and a fluorescent lamp (gas discharge lamp) with the series circuit being connected between the output 103 and lower supply potential GND. A further example of a load that allows ZVS operation is a LLC converter. Such LLC converter includes a series circuit with a series resonance circuit having a resonance inductance and a resonance capacitor, and a primary winding of a transformer. In this connection the transformer includes a secondary winding being inductively coupled to the primary winding, a rectifier arrangement being connected downstream the secondary winding. The resonance inductance may be part of a transformer, if the inductive coupling between the primary winding and the secondary winding is less than 1.

A zero-voltage operation of the half-bridge is basically possible if the load illustrates an inductive behavior at the drive frequency with which the switching elements 101, 102 are switched on and off. In a lamp circuit this is the case, if the drive frequency is higher than a resonance frequency of the series resonance circuit, or if there is a strong attenuation of the oscillator circuit through the lamp. The latter is the case after ignition of the lamp.

For the sake of completeness it should be mentioned that the switching elements 101, 102 may include switching delays. These switching delays have the effect that the switching elements 101, 102 switch on time-delayed after an on-level of the corresponding drive signal S1, S2, and switch off time-delayed after an off-level of the corresponding drive signal S1, S2. However, these switching delays are not illustrated in FIG. 2.

The time period within which the output voltage $V_{HB}$ changes its amplitude during the dead time $T_D$, or within which the potential at output 103 is recharged will be referred to as recharging time in the following. With ideal switching elements 101, 102, ideal connecting lines and an ideal load, that does not include parasitic capacitances, this recharging time would be zero. Since those parasitic capacitances are inevitably present, this recharging time is different from zero. In certain applications, such as use of the half-bridge in a lamp ballast, it may be desired to extend the recharging time beyond the period as given by the parasitic capacitances. For this purpose a further capacitance is connected in parallel with one of the half-bridge switching elements 101, 102. In the circuit according to FIG. 1 such an optional capacitance 104 (illustrated in dashed lines) is exemplary connected in parallel with the lower switching element 102.

For operating the half-bridge it is desired to adapt the dead time $T_D$ to the recharging time in such a way that the switching element that is to be switched on next is switched on after the end of the recharging process, with a delay that is as small as possible. In an ideal case the dead time corresponds to the recharging process or is somewhat longer than the recharging time, such as 2% to 20% longer than the recharging time.

Figure 3:
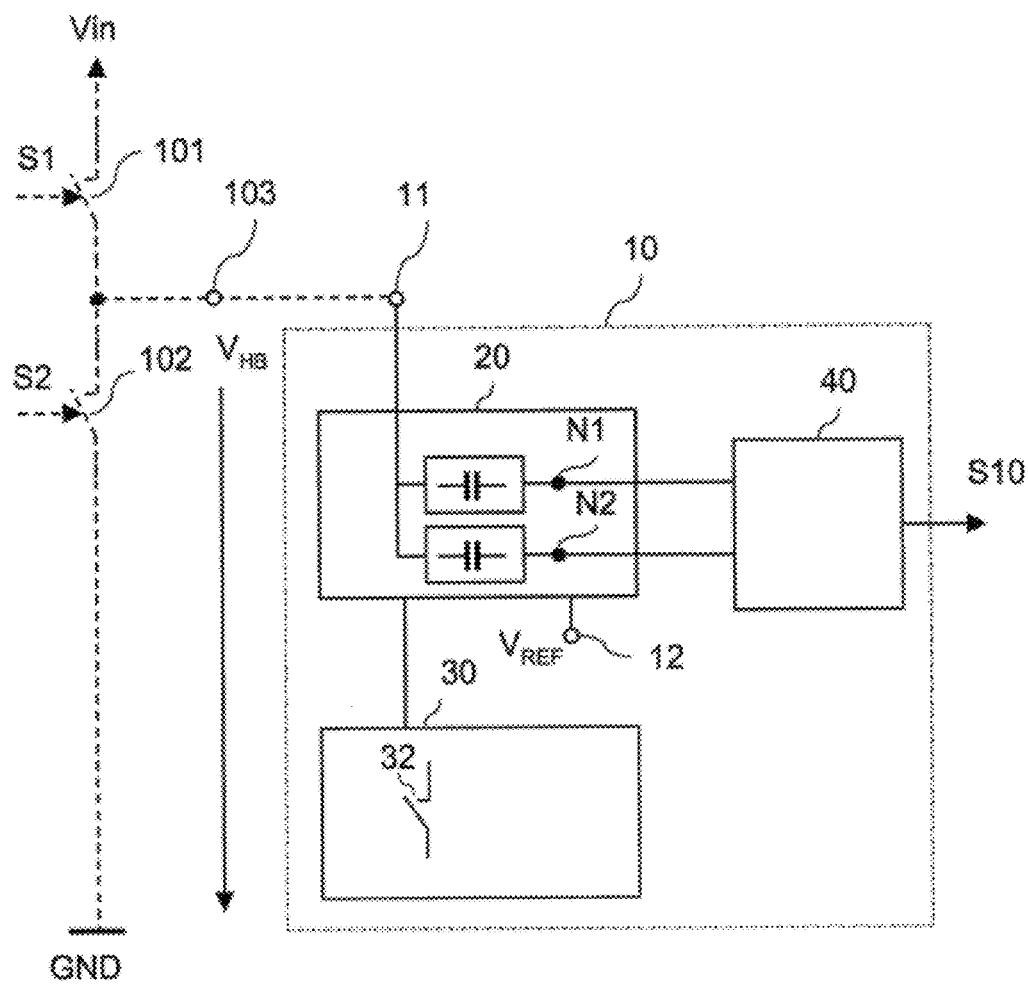
FIG. 3 by way of a block diagram illustrates a circuit arrangement having a capacitive network, a recharging circuit and a comparator arrangement for determining a variation with time of an output voltage of the half-bridge.

A circuit arrangement and a method for adaptively adjusting the dead time of a half-bridge operating in ZVS mode will be illustrated in the following. FIG. 3 illustrates a block diagram of such circuit arrangement 10. This circuit arrangement 10 includes an input 11 that may be coupled to the output 103 of the half-bridge (illustrated in dashed lines) and through which the output voltage $V_{HB}$ of the half-bridge can be provided to the circuit arrangement. The circuit arrangement 10 further includes a capacitive network 20 having a first and a second circuit node N1, N2 that are capacitively coupled to the input 11, and therefore to the output 103 of the half-bridge, and having a terminal for a reference potential $V_{REF}$. The circuit arrangement 10 further includes a recharging circuit 30 for the capacitive network 20, the re-charging circuit including at least one switching element 32. This recharging circuit is adapted during the switched-on phase of one of the switching elements 101, 102 of the half-bridge to adjust electrical potentials $V_{N1}$, $V_{N2}$ at the first and the second circuit node N1, N2 that are different from the reference potential $V_{REF}$. In the examples that will first be explained in the following these electrical potentials $V_{N1}$, $V_{N2}$ are selected such that they are not only different from the reference potential $V_{REF}$, but are also different from one another. However, this additional condition is not mandatory, as will be explained in the following.

The first and the second circuit nodes N1, N2 of the capacitive network 20 are connected to a comparator arrangement that is adapted to determine during the dead time a time difference between those times at which the electrical potentials at the first and the second nodes N1, N2 each assume a given potential value. In a manner that will be explained in the following this time difference is a measure for the time variation of the output voltage. This time variation of the output voltage $V_{HB}$ in turn determines the dead time that is at least required to provide for a complete recharging of the output 103 during the dead time.

Figure 4:
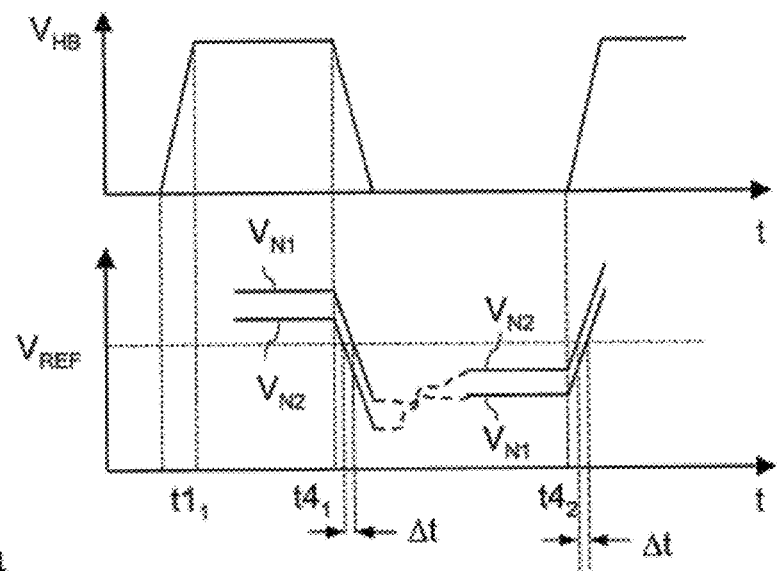
FIG. 4 illustrates the operating principle of the circuit arrangement illustrated in FIG. 3 by way of signal timing diagrams.

The operating principle of the circuit arrangement illustrated in FIG. 3 will become apparent with the help of timing diagrams, that are illustrated in FIG. 4, of the output voltage $V_{HB}$ and with the help of electrical potentials $V_{N1}$, $V_{N2}$ of the circuit nodes N1, N2 in the capacitive network.

Times $t1_1$ and $t4_1$ in FIG. 4 denote a time period during which the output voltage $V_{HB}$ assumes an upper voltage level. If switching delays of the switching elements 101, 102 are neglected, these are the times between which the upper switching element 101 is switched on. During this switched-on period of the first switching element 101, 102 the first and the second circuit nodes N1, N2 are charged to electrical potentials that are different relating to the reference potential $V_{REF}$. The level of the reference potential $V_{REF}$ is illustrated in dash-dotted lines in FIG. 4. For the following explanation it may be assumed that the explained potentials or voltages, respectively, are each related to the second supply potential or reference potential GND, respectively.

If the output voltage $V_{HB}$ changes starting with time t4, due to the capacitive coupling of the circuit nodes N1, N2 to the output 103 the electrical potentials $V_{N1}$, $V_{N2}$ of these circuit nodes also change. Changes with time of these electrical potentials $V_{N1}$, $V_{N2}$ at the first and second circuit nodes N1, N2 are identical in the example as illustrated. Due to the different values these electrical potentials $V_{N1}$, $V_{N2}$ have before a change of the output voltage $V_{HB}$ the electrical potentials $V_{N1}$, $V_{N2}$ of the two circuit nodes N1, N2 reach a given potential value which is for example the potential value $V_{REF}$ of the reference voltage, at different times. This time difference $\Delta t$ is dependent on the difference of the potentials $V_{N1}$, $V_{N2}$ of the two circuit nodes N1, N2, and is dependent on the variation of the output voltage $V_{HB}$ with time.

The electrical potentials $V_{N1}$, $V_{N2}$ of the two circuit nodes N1, N2 are adjusted by the recharging circuit 30 during the switched-on phases one of the switching elements—i.e., during the switched-on phase of the first switching element 101, 102 between times $t1_1$, $t4_1$, for example—such that they are known or that the differences $V_{N1}-V_{REF}$ or $V_{N2}-V_{REF}$ between these electrical potentials and the reference potential, respectively are known, and are in one embodiment proportional to the amplitude of the output voltage $V_{HB}$. Knowing this relation between the electrical potentials $V_{N1}$, $V_{N2}$ at the first and second circuit nodes N1, N2, a time variation of the output voltage $V_{HB}$ related to its amplitude may directly be derived from the time difference $\Delta t$. The ratio between the variation of the output voltage $V_{HB}$ with time and the amplitude of the output voltage is a direct measure for the change with time.

The mentioned proportionality between the differences $V_{N1}-V_{REF}$ or $V_{N2}-V_{REF}$, respectively, that settle in and the amplitude of the output voltage $V_{HB}$ means, that these differences change proportional to the amplitude of the output voltage $V_{HB}$, if the amplitude changes. The amplitude of the output voltage $V_{HB}$ changes, for example, if the input voltage Vin changes. In this connection it may be assumed that those changes occur slowly as compared to the switching frequency of the switching elements 101, 102.

For explanation purposes it may be assumed that the capacitive coupling between the first and second circuit nodes N1, N2 and the output 103 is constant, and that the potentials $V_{N1}$, $V_{N2}$ at these nodes change linearly with the output voltage $V_{HB}$. Changes of the potentials $V_{N1}$, $V_{N2}$ with time are, therefore, proportional to changes of the output voltage $V_{HB}$ with time. If one considers additionally the proportionality between the differences $V_{N1}-V_{REF}$ or $V_{N1}-V_{REF}$, respectively, that settle in and the amplitude of the output voltage $V_{HB}$, then the time difference $\Delta t$ is inversely proportional to the change of the output voltage $V_{HB}$ over time, namely independent of how large the changes of the potentials at the first and the second node N1, N2 really are. The only prerequisite is that the time difference $\Delta t$ is not zero. This prerequisite can be obtained in that the differences $V_{N1}-V_{REF}$ or $V_{N2}-V_{REF}$, respectively, are set to different values, and that the potentials $V_{N1}$, $V_{N2}$ with a change of the output voltage $V_{HB}$ change in the same manner, this being the case for the circuit arrangement explained with reference to FIGS. 5 and 8 in the following. Alternatively, the differences $V_{N1}-V_{REF}$ or $V_{N2}-V_{REF}$, respectively, may be adjusted to identical values (not zero). In this case the circuit nodes N1, N2 are coupled to the output 103 in such a way that variations with time of the electrical potentials $V_{N1}$, $V_{N2}$ are different with a change of the output voltage $V_{HB}$.

If the proportionality between the differences $V_{N1}-V_{REF}$ or $V_{N2}-V_{REF}$, respectively, and the amplitude of the output voltage $V_{HB}$ due to parasitic effects is not exactly given, than the circuit functions as good as the proportionality is adjusted. If the adaptively adjusted dead time is somewhat longer than the recharging time, then such non-proportionality can be tolerated.

The comparator arrangement 40 determines this time difference $\Delta t$ and provides a dead time signal S10 that is dependent on this time difference. This dead time signal S10 can be provided to a drive circuit (60 in FIG. 1) for generating the drive signals S1, S2. Dead time signal S10 either provides a measure for the dead time that is to be adjusted between the switched-on phases of the two switching elements 101, 102, or represents an enable signal that defines times at which the switching element to be switched-on next can be switched-on.

In an equivalent manner as during this switched-on phase of the first switching element 101 the change over circuit 30 during the switched-on phase of the second switching element 102 adjusts different potentials $V_{N1}$, $V_{N2}$ at the first and second circuit nodes N1, N2. In FIG. 4 $t4_2$ denotes a time from which the output voltage $V_{HB}$ increases after switching off the second switching element 102. Due to the capacitive coupling of the two circuit nodes N1, N2 to the output 103 the electrical potentials $V_{N1}$, $V_{N2}$ of these circuit nodes increase with the same slope as the output voltage $V_{HB}$, with a time difference $\Delta t$ between times at which these electrical potentials $V_{N1}$, $V_{N2}$ assume a given potential, such as reference potential $V_{REF}$, directly represents a measure for the change of the output voltage $V_{HB}$ over time.

Figure 5:
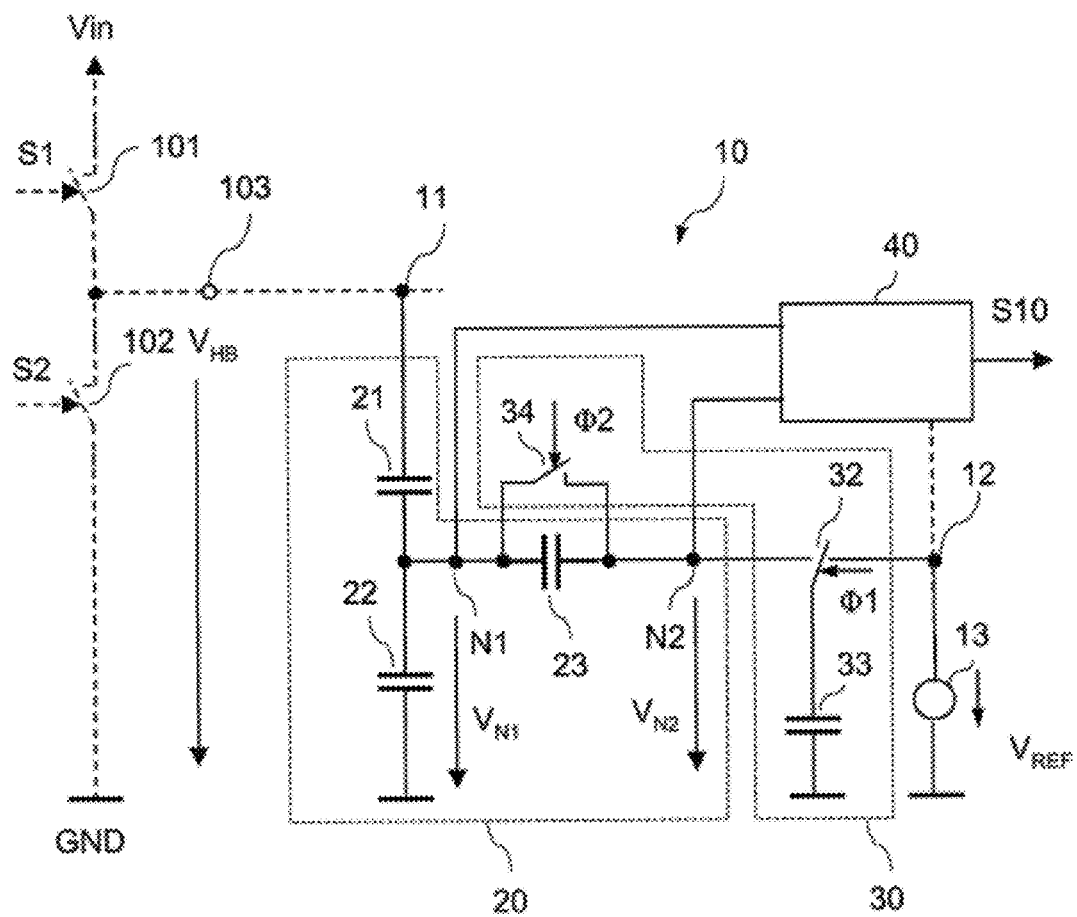
FIG. 5 illustrates an implementation example of the capacitive network and the recharging circuit of the circuit arrangement according to FIG. 3 by way of electrical circuit diagrams.

FIG. 5 by way of an electrical circuit diagram illustrates a first example of the first capacitive network 20 and the recharging circuit 30.

In the example as illustrated a capacitive network 20 includes a capacitive voltage divider having a first and a second capacitance 21, 22 that are coupled between the input 11 of the circuit arrangement 10 or the output 103 of the half-bridge, respectively, and a further reference potential. In the example as illustrated the further reference potential is the second reference potential, so that the output voltage $V_{HB}$ is the voltage across the capacitive voltage divider 21, 20, 22. The first circuit node N1 of the capacitive network is formed by a tap of the capacitive voltage divider, the tap being a circuit node that is common to the two capacitances 21, 22 of the voltage divider.

The capacitive network 20 further includes a third capacitance that is coupled to the tap of the capacitive voltage divider 21, 22. The second circuit node N2 is formed by a terminal facing away from the tap of the third capacitance 23. In this capacitive network 20 the first circuit node N1 via first capacitance 21 of the voltage divider is capacitively coupled to the output 103 of the half-bridge, and the second circuit node N2 via this series circuit with the first capacitance 21 and the third capacitance 23 is capacitively coupled to the output 103. The potential difference between the electrical potentials $V_{N1}$ of the first circuit node N1 and the electrical potential $V_{N2}$ of the second circuit node N2 equals the voltage across the third capacitance 23.

The recharging circuit 30 of this circuit arrangement 10 includes a fourth capacitance 23 that is connected between the terminal for the further reference potential GND and a first switching element 32 of the recharging circuit 30. The first switching element 32 is a selector switching element that is adapted to connect the fourth capacitance 33 selectively to the second circuit node N2 or to the terminal for the reference potential $V_{REF}$. In the circuit arrangement as illustrated the reference potential is generated by a reference voltage source 13 that is coupled between the terminal for the further reference potential, i.e., the second supply potential in the example, and the terminal for the reference potential $V_{REF}$. The voltage generated by the reference voltage source 13 will be referred to as reference voltage in the following. The re-charging circuit 30 further includes a second switch 34 that is connected parallel with the third capacitance 23 of the capacitive network 20.

Figure 6:
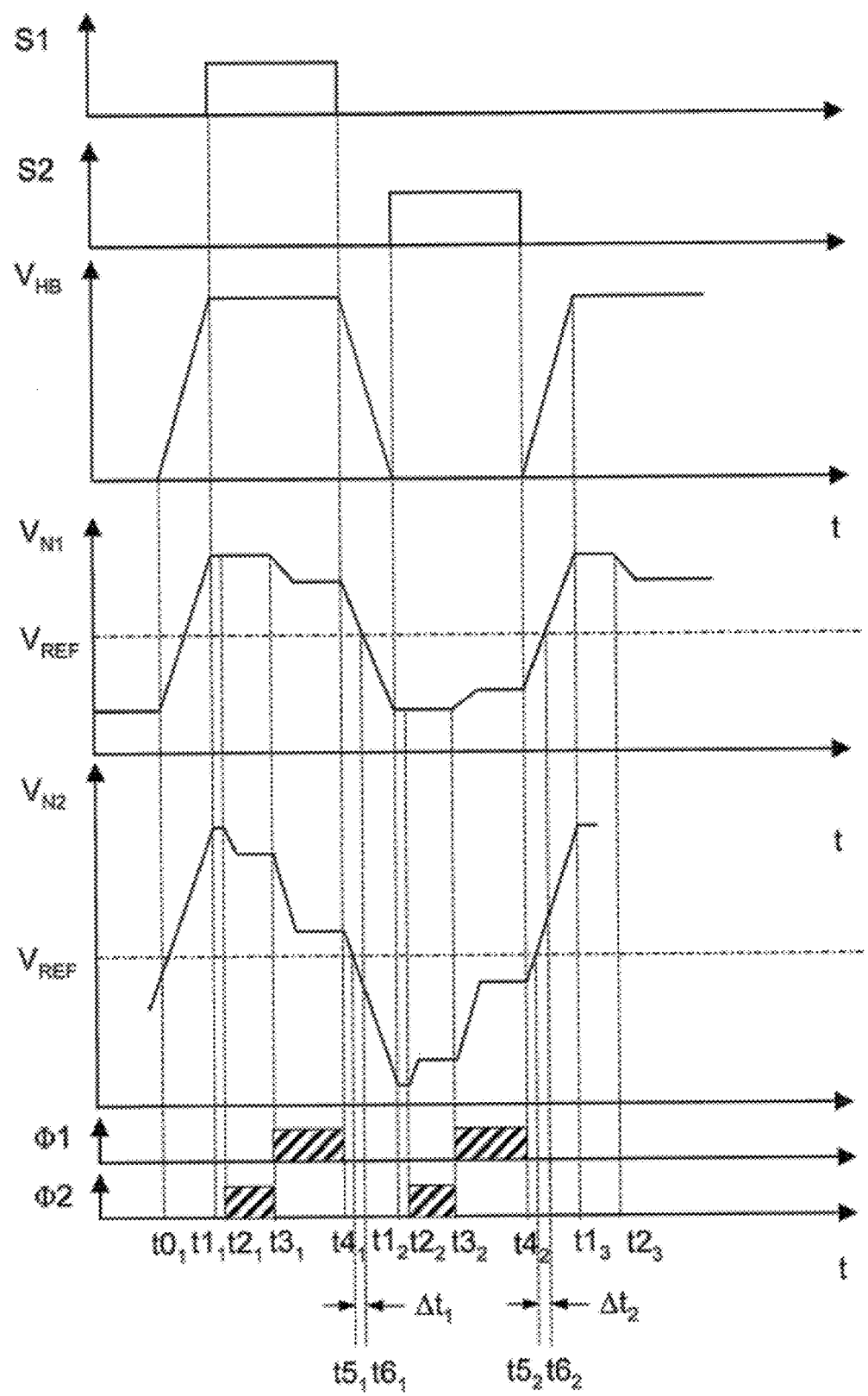
FIG. 6 illustrates the operating principle of the capacitive network and the re-charging circuit according to FIG. 5 by way of signal timing diagrams.

The operating principle of the circuit arrangement 10 illustrated in FIG. 5 will now be explained with reference to FIG. 6, in which timing diagrams of the output voltage $V_{HB}$, of the electrical potential $V_{N1}$ of the first circuit node N1, and the electrical potential $V_{N2}$ of the second circuit node N2 are illustrated. Further, the drive signals $\Phi 1$, $\Phi 2$ for the first and second switch 32, 34 of the change over circuit are illustrated in FIG. 6. For explanation purposes these signals are examined during a complete drive cycle of the half-bridge, the drive cycle beginning at time $t0_1$, at which the half-bridge voltage $V_{HB}$ increases, and ending at time $t4_1$, at which the half-bridge voltage $V_{HB}$ again starts to increase. During the increase of the output voltage $V_{HB}$, the first switch 32 is in a first switching position at which the fourth capacitance 33 is connected to the reference potential $V_{REF}$ of voltage source 31; this switching position is represented in FIG. 6 by a low-level of drive signal $\Phi 1$. During the increase of the output voltage $V_{HB}$ second switch 34 is open, which is represented by a low-level of the drive voltage signal $\Phi 2$. Thus, during the increase of the output voltage $V_{HB}$ the first and the second circuit nodes N1, N2 are only coupled to the input terminal 1 and the output 103 of the half-bridge, respectively, namely capacitively via the first capacitance 21 and the series circuit with the first capacitance 21 and the second capacitance 23, respectively. The electrical potentials at these circuit nodes N1, N2 therefore immediately change with a change of the output voltage $V_{HB}$ over time, with changes with time $dV_{N1}/dt$ and $dV_{N2}/dt$ of the first and second potential $V_{N1}$, $V_{N2}$ being identical for the circuit according to FIG. 5. It therefore applies:

$$\frac{dVN_1}{dt} = \frac{dVN_2}{dt}. \tag{1}$$

These changes with time of the first and second potentials $V_{N1}$, $V_{N2}$ are directly related to a change with time of the output voltage $V_{HB}$ via the divider ratio of the capacitive voltage divider 21, 22, where it applies:

$$\frac{dVN_1}{dt} = \frac{dVN_2}{dt} = \frac{dV_{HB}}{dt} \cdot \frac{C21}{C21 + C22}. \tag{2}$$

In this connection C21 and C22 are capacitance values of the first and second capacitances of the voltage divider, which will be referred to as first and second capacitance value in the following. Referring to equation (2) for a given change with time of the output voltage $V_{HB}$ the changes with time of the first and second potentials $V_{N1}$, $V_{N2}$ are the larger, the larger the first capacitance value C21 is compared to the second capacitance value C22. By a suitable choice of the relationship between these two capacitance values C21, C22 the voltage change of the first and second potentials $V_{N1}$, $V_{N2}$ can be adjusted. The input voltage $V_{in}$ of the half-bridge, dependent on the load Z that is to be driven, may amount up to several hundred volts, so that also the voltage change of the output voltage may amount up to several hundred volts. A usual drive of a half-bridge for driving a lamp ballast having a discharge lamp amounts to about 400V.

With a suitable choice of the first and second capacitance values C21, C22 a large voltage change at output 103 is transferred to a correspondingly lower voltage change of the first and second potentials $V_{N1}$, $V_{N2}$ through the capacitive voltage divider 21, 22. Through the choice of the capacitance values C21, C22, for example, this voltage change may be adjusted to amount only some volts, so that for evaluating these potentials $V_{N1}$, $V_{N2}$ no high-voltage components are required. In this case only the first capacitance needs to have a voltage blocking capability of up to several hundred volts. One way of realizing such capacitance will be explained hereinbelow.

In FIG. 6 $t1_1$ denotes a time at which the output voltage $V_{HB}$ reaches its upper voltage level. For explanation purposes it may be assumed that the first switching element 101 assumes an on-level at this time and stays at this on-level till a later time $t4_1$. Possible delays in switching on the switching element are not taken into account in the illustration in FIG. 6, because they are not relevant for explaining the basic operating principle of the circuit arrangement according to FIG. 5. During this on-period of the first switching element 101 first the second switch 34 of the recharging circuit 30 is switched on in order to discharge the third capacitance 23, and subsequently the first switch 32 is switched into the second switching position in order to connect the fourth capacitance 33 to circuit node N2. In FIG. 6 $t2_1$ denotes a time at which the second switch 34 is closed, and $t3_1$ denotes a time at which this switch is again opened. During a time period between time $t3_1$ and a later time $t4_1$ the first switch 32 is in the second position. In this connection it should be mentioned that the switching periods during which the second switch 34 is closed and during which the first switch 32 is in the second switching position are not necessarily subsequent, but may be distant to one another over time. Further, the time period during which the first switch 32 is in the second switching position may already end before time $t4_1$ from which the output voltage $V_{HB}$ starts to decrease.

The explained driving of the first and second switches 32, 34 during the switched-on phase $t1_1$-$t4_1$ of the first switching element 101 serves to adjust the electrical potentials $V_{N1}$, $V_{N2}$ at the first and second circuit nodes N1, N2 to different potential values related to the reference potential $V_{REF}$ or related to the further reference potential GND.

As will be explained hereinbelow the second potential $V_{N1}$ increases with increasing output voltage $V_{HB}$ to a higher final value than the first potential $V_{N1}$. In this connection "final value" denotes the voltage value the first and second potentials $V_{N1}$, $V_{N2}$ have when the output voltage $V_{HB}$ reaches its upper voltage level. If the second switching element 34 is closed during time period $t2_1$-$t3_1$, the third capacitance 23, that has been charged before, is discharged, and the second potential $V_{N2}$ decreases to the value of the first potential $V_{N1}$ at first.

As it will also be explained the first electrical potential $V_{N1}$ during the switched-on phase of the first switching element 101 and during the time period, during which the output voltage $V_{HP}$ assumes its upper voltage level, lies above the reference potential $V_{REF}$. If the first switch 24 is opened, and the second switch 32 is in the second switching position, the second capacitance 22 is discharged for the benefit of the third capacitance 24 and the fourth capacitance 33. This results in that the first electrical potential $V_{N1}$ decreases, and in that also the second electrical potential $V_{N2}$ decreases, namely until the sum of the voltages across the third capacitance 23 and the second electrical potential $V_{N2}$ equals the first electrical potential $V_{N1}$.

It can be illustrated that the third capacitance 23 is charged to a voltage V23 during the time period $t3_1$-$t4_1$ for which applies:

$$V23(t4_1) = \left[\frac{V_{N1}(t3_1) - V_{REF}}{\frac{1}{C22} + \frac{1}{C23} + \frac{1}{C33}}\right] \cdot \frac{1}{C23}. \quad (3)$$

In this connection $V_{N1}$ denotes the electrical potential at the first node N1 at time $t3_1$, $V_{REF}$ denotes the reference voltage, C22 denotes the capacitance value of the second capacitance, C23 the capacitance value of the third capacitance 23, and C33 the capacitance value of the fourth capacitance 33. Equation (3) is valid under the assumption that the capacitance value C21 of the first capacitance 21 is almost negligible compared to the capacitance value C22 of the second capacitance 22, i.e., if, for example, the capacitance value C21 of the first capacitance 21 is smaller than the capacitance value C22 of the second capacitance 22 for a factor 50 or more, or in one embodiment for a factor 100 or more.

For the first electrical potential $V_{N1}$ at the end of the switching time of the first switch 32, i.e., at time $t4_1$, the following applies accordingly and under the same assumption:

$$V_{N1}(t4_1) = V_{N1}(t3_1) - \frac{1}{C22} \cdot \left[\frac{V_{N1}(t3_1) - V_{REF}}{\frac{1}{C22} + \frac{1}{C23} + \frac{1}{C33}}\right]. \quad (4)$$

In this connection $V_{N1}(t4_1)$ denotes the first potential $V_{N1}$ at time $t4_1$, $V_{N1}(t3_1)$ denotes the first potential $V_{N1}$ at time $t3_1$, i.e., before discharging the second capacitance 22. For the second electrical potential $V_{N2}$ at time $t4_1$ applies:

$$V_{N2}(t4_1) = V_{N1}(t4_1) - V23(t4_1) \quad (5).$$

Considering equations (3) and (4) it is obvious that the first and second electrical potentials at time $t4_1$ have a fixed relationship with each other that is only dependent on the capacitance values of the second, third and fourth capacitances 22, 23, 33, the reference voltage $V_{REF}$ and the first electrical potential $V_{N1}(t3_1)$ at time $t3_1$.

From time $t4_1$ the second switch 34 is still open, and the first switch 32 is again in the first switching position, so that the first and the second circuit nodes N1, N2 are only capacitively coupled to the output 103. If the output voltage $V_{HB}$ decreases starting with time $t4_1$, then the electrical potentials at the first and second circuit nodes N1, N2 change in accordance with equations (1) and (2), that have been explained hereinabove. In FIG. 6 $t5_1$ denotes a time at which the second electrical potential $V_{N2}$ reaches the reference potential $V_{REF}$, and $t6_1$ denotes a time at which the first electrical potential $V_{N1}$ reaches the reference potential $V_{REF}$. $\Delta t_1$ denotes a time difference between these two times $t5_1$, $t6_2$, $\Delta t_1$ being a direct measure for the change with time of the output voltage $V_{HB}$, which will be explained further below.

In FIG. 6 $t1_2$ denotes a time at which the output voltage $V_{HB}$ has decreased to its lower voltage level. From this time during the negative half-cycle of the output voltage $V_{HB}$ the same drive cycle of the first and second switches 32, 34 starts, as it has been explained before for the time period $t1_1$ to $t4_1$ during the positive half-cycle of the output voltage $V_{HB}$. Same times during the negative half-cycle are denoted with the same reference characters as the corresponding times during the positive half-cycle, these reference characters being only different in the subscript indices, with index "1" denoting the times during the positive half-cycle, and the index "2" denoting the corresponding times during the negative half-cycle. During a time period $t2_2$ to $t3_2$ the second switch 34 is closed in order to discharge the third capacitance 23. The second electrical potential $V_{N2}$ adapts itself to the first electrical potential $V_{N1}$, which means during the negative half-cycle that the second electrical potential $V_{N2}$ increases. During the time period $t3_2$ to $t4_2$, during which the first switch 32 is in the second switching position in order to connected the fourth capacitance to the second circuit node N2, the second capacitance 22 is charged during the negative half-cycle by the fourth capacitance 33, that has been charged to the reference voltage $V_{REF}$ before. Equations (3) to (5) for the voltage V23 across the third capacitance 23, as well for the first and second electrical potential $V_{N1}$, $V_{N2}$ at time $t4_2$, apply accordingly, where in these equations time $t3_1$ is to be replaced by $t3_2$, and $t4_1$ is to be replaced by $t4_2$.

In FIG. 6 $t4_2$ denotes a time at which the output voltage $V_{HB}$, and thus the first and second electrical potentials $V_{N1}$, $V_{N2}$ increase. At a time $t5_2$ the second electrical potential $V_{N2}$ reaches the reference potential $V_{REF}$, and at a time $t6_2$ the first potential $V_{N1}$ reaches the reference voltage $V_{REF}$. In FIG. 6 $\Delta t_2$ denotes the time difference between these times $t5_2$, $t6_2$.

If the input voltage of the half-bridge (Vin in FIG. 1) does not change over the time, then the voltage change during the transfer from the lower voltage level to the upper voltage level and during the transfer from the upper voltage level to the lower voltage level is identical. In steady-state, i.e., after a sufficient number of switching periods with the same voltage change of the output voltage $V_{HB}$, the timing diagrams of the first and second potentials $V_{N1}$, $V_{N2}$ are symmetrically related to the reference potential $V_{REF}$. Thus, the first potential $V_{N1}$ before a falling edge of the output voltage $V_{HB}$ has the same amplitude related to the reference potential $V_{REF}$ as before a rising edge of the output voltage $V_{HB}$, the absolute value of the difference between the first potential $V_{N1}$ and the reference potential $V_{REF}$ is thus identical before a rising edge and before a falling edge of the output voltage $V_{HB}$, i.e., at times $t4_1$, $t4_2$. In the explanation hereinabove these amplitudes of the first potential $V_{N1}$ before the falling edge and the rising edge, respectively, of the output voltage $V_{HB}$ are referred to as $V_{N1}(t4_1)$ and $V_{N1}(t4_2)$. It therefore applies:

$$|V_{N1}(t4_1)-V_{REF}|=|V_{N1}(t4_2)-V_{REF}| \qquad (6a).$$

Accordingly the amplitude of the second potential $V_{N2}$ related to the reference potential $V_{REF}$ before a falling edge and before a rising edge of the output voltage $V_{HB}$ is identical, so that the following applies accordingly:

$$|V_{N2}(t4_1)-V_{REF}|=|V_{N2}(t4_2)-V_{REF}| \qquad (6b).$$

If the input voltage Vin is unchanged, then the absolute changes of the first and second potentials $V_{N1}$, $V_{N2}$ are identical during the rising edge and during the falling edge of the output voltage $V_{HB}$. This change with time during the dead time, which will be referred to as signal change in the following, according to equation (2) is dependent on the signal change of the output voltage $V_{HB}$ via the divider ratio of the capacitive voltage divider. In steady-state of the circuit arrangement the time differences $\Delta t_1$, $\Delta t_2$ are, however, not dependent on the capacitive voltage divider ratio, but are only dependent on the capacitances within the capacitive network 20 and recharging circuit 30. As it will be explained in the following, this allows for a use of a capacitive component as the first capacitance that has no specific requirements concerning precision of the capacitance value. Thus, a capacitive component may be used as the first capacitance 21 that, due to the production process, has high tolerances of its capacitance value.

The independence of the time difference At of the capacitance value C21 of the first capacitance applies under the assumption that the capacitance value C21 of the first capacitance C21 is negligible compared to the capacitance value C22 of the second capacitance 22. In this case the amplitude or the signal change, respectively, of the output voltage $V_{HB}$ is large compared to the signal changes of the first and second potentials $V_{N1}$, $V_{N2}$. The product of the signal change of the output voltage $V_{HB}$ and the capacitance value C21 of the first capacitance then equals the amount of charge that during each recharging flows into the second capacitor 22 or from this. A change of the capacitance value C21 of the first capacitance therefore has the same influence as a change of the signal change of the output voltage $V_{HB}$. If, as it has been explained before, the voltage differences $V_{N1}-V_{REF}$ and $V_{N2}-V_{REF}$ respectively are proportional to the amplitude of the output voltage $V_{HB}$, then a change of the first capacitance C21, like a change of a signal change, only effects scaling the timing diagrams of the first and second potentials $V_{N1}$, $V_{N2}$ related to the reference voltage $V_{REF}$ as a virtual zero-line. The waveforms or their time dependencies do not change. Since $V_{REF}$ is simultaneously the comparator threshold for determining the time difference $\Delta t$, a scaling does not affect these "zero-crossings" t5, t6 related to $V_{REF}$.

The symmetry of the first and second potentials $V_{N1}$, $V_{N2}$ to the reference voltage $V_{REF}$ is achieved in the capacitive network 20 illustrated in FIG. 5 in that the second circuit node N2, and via the third capacitance 23 also the first circuit node N1, is connected to the fourth capacitance 33, that has been charged to the reference voltage $V_{REF}$ before, during each switched-on phase of a switching element 101, 102. During the switched-on phase of the first switching element 101 (positive half-cycle of the output voltage $V_{HB}$) the second capacitance 22 is partly discharged for the benefit of the fourth capacitance 33, and during the switched-on phase of the second switching element 102 (negative half-cycle of the output voltage $V_{HB}$) the second capacitance is charged on account of the fourth capacitance 23. The capacitive network 20 is in its steady state—with unchanged input voltage Vin over time—, if the charge that flows from the second capacitance 22 during the switched-on phase of the first switching element 21 equals the charge that flows back into the second capacitance 22 during the switched-on phase of the second switching element 102 from the fourth capacitance 23. A transient phase until reaching such steady-state will now be explained with reference to FIG. 7.

Figure 7:
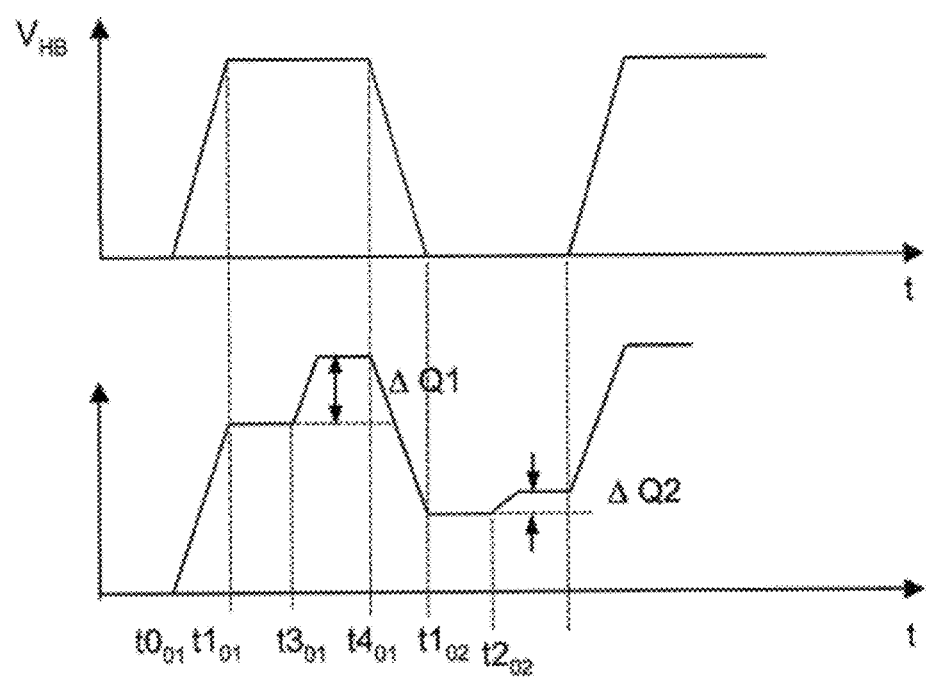
FIG. 7 illustrates the operating principle of the capacitive network according to FIG. 5 during a start-up or transient phase.

FIG. 7 illustrates exemplary timing diagrams of the output voltage $V_{HB}$ of the first potential $V_{N1}$. For the purpose of explanation it may be assumed that the first capacitance 22 is not charged before a first increase of the output voltage $V_{HB}$, i.e., that its charge at time $t0_{01}$ is zero. If the output voltage $V_{HB}$ increases to its upper voltage value then the first potential $V_{N1}$ at time $t1_{01}$, at which the output voltage $V_{HB}$ for the first time reaches the upper voltage level, is directly dependent on the output voltage $V_{HB}$ via the divider ratio of the capacitive voltage divider. In FIG. 7 $t3_{01}$ denotes a time at which the first switch 32 is switched into the second switching position in order to connect the fourth capacitance 33 to the second circuit node N2, so that the second capacitance 22 is discharged. Since the second capacitance 22 at the beginning of the transient phase is less charged then in the steady-state, from time t3 the second capacitance 22 is first charged via the third capacitance 33, so that the potential at the first node N1 increases. If from time t4 the output voltage $V_{HB}$ decreases, then the second capacitance 22 is not completely charged anymore, i.e., the first potential $V_{N1}$ does not decrease to the further reference potential GND anymore. During the negative half-cycle of the output voltage $V_{HB}$ the second capacitance 22 at closed second switch 32 is also charged by the fourth capacitance 33, namely from time $t2_{02}$ according to FIG. 7. The transient phase has come to an and, when the second capacitance 22 after a number of drive cycles is charged to such an extent that during the positive half-cycle of the output voltage $V_{HB}$ the same amount of charge $\Delta Q1$ flows from the second capacitance 22 at closed second switch 32 into the fourth capacitance 23, as charge $\Delta Q2$ flows during the negative half-cycle of the output voltage $V_{HB}$ at closed second switch 32 from the fourth capacitance 33 into the second capacitance 22. It therefore applies: $-\Delta Q1=\Delta Q2$.

Figure 8:
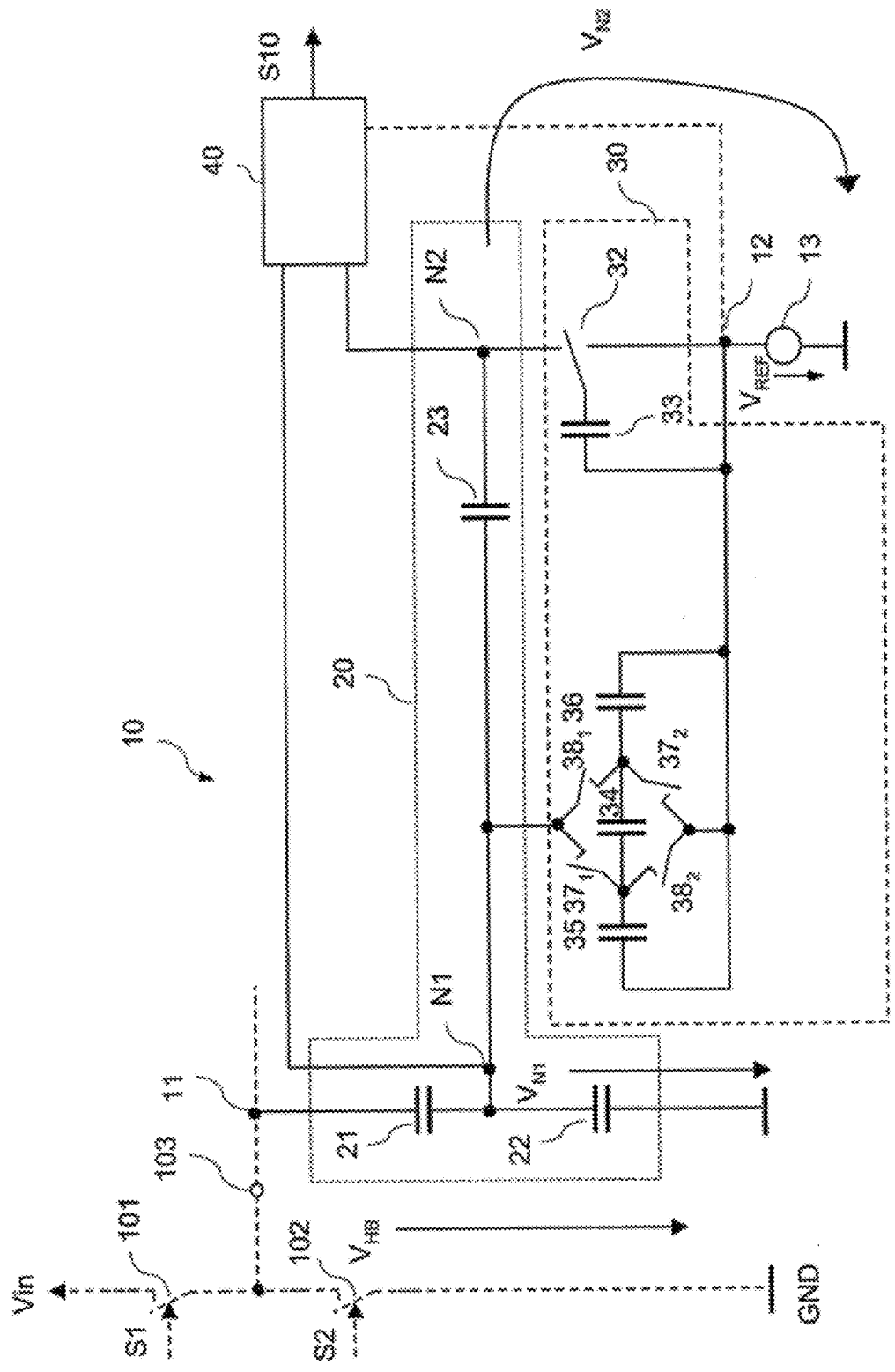
FIG. 8 illustrates a further example of a capacitive network and a recharging circuit of the circuit arrangement according to FIG. 3 by way of electrical circuit diagrams.

FIG. 8 illustrates a further example of the recharging circuit 30. The fourth capacitance 33 of this recharging circuit 30 is connected between the terminal 12 for the reference potential $V_{REF}$ and the first switch 32, the first switch 32 being adapted to alternatively connect the terminal of the fourth capacitance 33—which in the example faces away from the reference potential terminal 12—to the reference potential terminal 12 or the second circuit node N2. In a manner not illustrated in detail in the circuit according to FIG. 8 the fourth capacitance 33, the first switch 32, and the second circuit node N2 could also be interconnected according to the example of FIG. 5, which means so that the third capacitance with one terminal permanently lies on the further reference potential, and that the other terminals by the first switch 32 can be switched between the terminal 12 for the reference potential $V_{REF}$ and the second terminal N2. In a corresponding manner, in the circuit according to FIG. 5 fourth capacitance 33 the first switch 32, and the second circuit node N2 could also be interconnected according to the example illustrated in FIG. 8.

The recharging circuit 30 further includes a bridge circuit having four bridge switches $37_1$, $37_2$, $38_1$, $38_2$ and a fifth capacitance 34. This bridge circuit is connected between the first circuit node N1 and the terminal 12 for the second reference potential $V_{REF}$. The four bridge switches and the fifth capacitance 34 are interconnected such, that a first switch pair with a first bridge switch $37_1$, and a second bridge switch $37_2$ switches the fifth capacitance 34, so as to have a first polarity, between the first circuit node N1 and the reference potential terminal 12, when these switches $37_1$, $37_2$ are closed, and that a second switch pair with a third and a fourth bridge switch $38_1$, $38_2$ switches the fifth capacitance 34, so as to have a second polarity, between the first circuit node N1 and the reference potential terminal 12, when the switches of this switch pair are closed. Thus, when the switches $37_1$, $37_2$ of the first switch pair are closed, a first terminal of the fifth capacitance 34 is connected to the first circuit node N1, and a second circuit node of the fourth capacitance 34 is connected to the reference potential terminal 12. With conducting switches $38_1$, $38_2$ of the second switch pair, in a corresponding manner, the second terminal of the fifth capacitance 34 is connected to the first circuit node N1, and the first terminal of the fifth capacitance 34 is connected to the reference potential terminal 12. Optionally a sixth capacitance 35 is connected between the first terminal of the fifth capacitance 34 and reference potential terminal 12, and between the second terminal of the fifth capacitance 34 and the reference potential terminal 12 a seventh capacitance 36 is connected.

Figure 9:
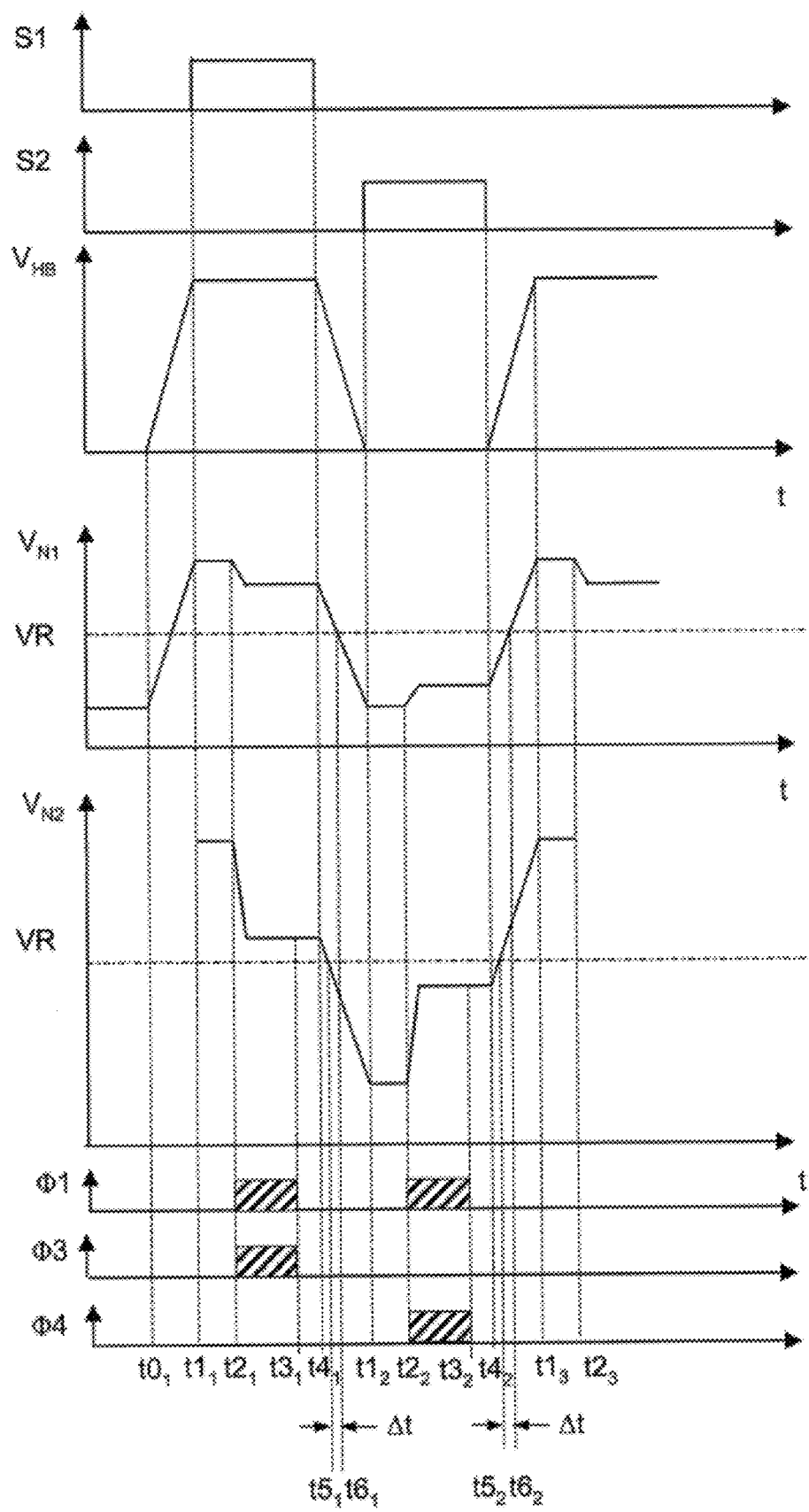
FIG. 9 illustrates the operating principle of the capacitive network and the re-charging circuit according to FIG. 8 by way of signal timing diagrams.

The operating principle of the circuit arrangement illustrated in FIG. 8 will become apparent with the help of timing diagrams of the output voltage $V_{HB}$, and the first and second potentials $V_{N1}$, $V_{N2}$ at the first and second circuit nodes N1, N2, the timing diagrams of which are illustrated in FIG. 9 for the steady-state. Illustrated in FIG. 9 are the timing diagrams of the drive signals of the individual switches. $\Phi 1$ denotes the drive signal of the first switch 32. In the example illustrated a low signal level of this drive signal $\Phi 1$ represents a switching state in which the fourth capacitance 33 is connected to the second reference potential terminal 12, so that the fourth capacitance 33 is short-circuited. This switching state will be referred to as first switching state in the following. An upper signal level of the drive signal $\Phi 1$ represents a switching state of the first switch 32 in which the fourth capacitance 33 is connected to the second circuit node N2. This switching state will be referred to as second switching state in the following.

In FIG. 9 $\Phi 3$ denotes the common drive signal of the bridge switches $37_1$, $37_2$ of the first switch pair, and $\Phi 4$ denotes the common drive signal for the bridge switches $38_1$, $38_2$ of the second switch pair. In the example illustrated the bridge switches are closed each time, their drive signal $\Phi 3$ or $\Phi 4$ assumes an upper signal level, and the switches are opened each time, their drive signal $\Phi 3$ or $\Phi 4$ assume a lower signal level. For a better understanding the first and second drive signals S1, S2 of the two half-bridge switches 101, 102 are also illustrated in FIG. 9.

In correspondence with the timing diagram in FIG. 6 $t1_1$ in FIG. 9 denotes a time at which the output voltage $V_{HB}$ reaches its maximum value during its positive half-cycle. Till this time all bridge switches $37_1$, $37_2$, $38_1$, $38_2$ are open, and the fourth capacitance 33 is short-circuited via the first switch 32. At a later time $t2_1$ during the positive half-cycle the bridge switches $37_1$, $37_2$ of the second bridge switch pair are closed, and the first switch 32 is switched into the second switching position, in order to connect the fourth capacitance 32 between the reference potential terminal 12 and the second circuit node N2. Through this the second capacitance 32 is discharged via optional sixth capacitance 35, so that the first potential $V_{N1}$ decreases. In the steady-state the charge in the capacitance 34 does not change. Further, the fourth capacitance 33 is discharged, so that the second electrical potential $V_{N2}$ also decreases. Through this, at the first and second nodes N1, N2 electrical potentials settle in that are different related to the reference potential $V_{REF}$. To what extent the second potential $V_{N2}$ decreases during this time period, i.e., to what extent this potential approaches the reference potential $V_{REF}$, is dependent on the capacitive capacitive voltage divider of the divider ratio formed by the third and fourth capacitance 23, 33. In FIG. 9 $t3_1$ denotes a time at which the recharging process at the first and second circuit nodes N1, N2 has come to an end, and at which the bridge switches $37_1$, $37_2$ are opened and the first switch 32 is again switched into the first switching state in order to interrupt the connection between the second circuit node N2 and the fourth capacitance 33. For a change in the second potential $V_{N2}$ between times $t2_1$ and $t3_1$ it applies:

$$\Delta V_{N2} = V_{N2}(t2_1) - V_{N2}(t3_1) = \frac{C33}{\frac{C22 \cdot C23}{C22+C23} + C33} \cdot [V_{N2}(t2_1) - V_{REF}]. \quad (7)$$

In this connection C23 denotes the capacitance value of the third capacitance 23, and C33 denotes the capacitance value of the fourth capacitance 33. The electrical potential VN2 decreases between times $t2_1$ and $t3_1$ the more, the larger the capacitance value C33 of the fourth capacitance 33 is compared with the capacitance of the series circuit with the second and third capacitances 22, 23. The ratio C33/C23 of the capacitance values of the third and fourth capacitances 23, 33 is, for example, between two and ten.

The change of the electrical potential $V_{N1}$ between times $t2_1$ and $t3_1$ is significantly determined by the ratio between the capacitance values C22 of the second capacitance and of the series circuit with the third and fourth capacitances 23, 33. These ratios are similar to the ratios in the circuit according to FIG. 5, with the difference that the third capacitance 23 is not discharged in between. From times $t2_1$ at $t2_2$ C23 is charged oppositely. The amount of charge that is required for this is twice as it would be, if third capacitance 23 would be discharged in between—such as it is the case in the circuit according to FIG. 5. The capacitance values of the optional sixth and seventh capacitances 35, 36 may be significantly smaller than the capacitance value of the fifth capacitance. The capacitance ratio between the capacitance value C35, C36 of one of these sixth and seventh capacitances and the capacitance value C34 of the fifth capacitance 34 is, for example, between ⅕ and ⅙. The sixth and seventh capacitances 35, 36 may, for example, be formed by line capacitances.

The capacitance value C34 of the fifth capacitance 34 may be in the same order of magnitude than the capacitance value C22 of the second capacitance 22. The ratio C34/C32 of this capacitance values is, for example, between 0,2 and 5.

By recharging processes of the first and second circuit nodes N1, N2 between times $t2_1$, $t3_1$ electrical potentials $V_{N1}$, $V_{N2}$ that are related to the second reference potential $V_{REF}$ and that are different from one another settle in at the first and second circuit nodes N1, N2.

In FIG. 9 $t4_1$ denotes a time from which the output voltage $V_{HB}$ decreases. The electrical potentials $V_{N1}$, $V_{N2}$ at the first and second circuit nodes N1, N2 change in the same manner, namely dependent on the changes with time of the output voltage $V_{HB}$. The changes with time of the electrical potentials $V_{N1}$, $V_{N2}$ at the first and second circuit nodes N1, N2 stand in relationship with the change with time of the output voltage $V_{HB}$ according to equation (2).

In FIG. 9 $t5_1$, $t6_1$ denote times at which the first and second electrical potential $V_{N1}$, $V_{N2}$ with the falling edge of the output voltage $V_{HB}$ reach the reference potential $V_{Ref}$. A time difference $\Delta t_1$ is here a direct measure for the change with time of the output voltage $V_{HB}$.

In FIG. 9 $t1_2$ denotes a time at which the output voltage reaches its maximum (negative) amplitude value during the negative half-cycle. After this time $t1_2$ the first switch 32 is again switched over at a time $t2_2$ in order to connect the third capacitance 33 to the second circuit node N2, and the bridge switches $38_1$, $38_2$ of the second switch pair are closed in order to connect the fifth capacitance 34 with reversed polarity between the first circuit node N1 and the reference potential terminal 12. Consequently the second capacitance 22 is charged via the series circuit with the third and fourth capacitances 22, 33, the charge present in the third capacitance 33 from the previous half-cycle contributing to charging the second capacitance 22. Thus, the potential $V_{N2}$ at the second circuit node N2 increases. In the steady-state the value of the first electrical potential $V_{N1}$ at time $t3_1$ related to the reference potential $V_{Ref}$ is symmetrical to the value of the first electrical potential $V_{N1}$ at time $t3_2$. Correspondingly the value of the second electrical potential $V_{N2}$ at time $t3_1$ related to the reference potential $V_{Ref}$ is symmetrical to the value of the second electric potential $V_{N2}$ at time $t3_2$. The timing diagrams of the first and second electrical potentials $V_{N1}$, $V_{N2}$ in the steady-state are therefore symmetrical related to the second reference potential $V_{Ref}$. In the circuit arrangement according to FIG. 8 a steady-state is reached the faster, the larger the capacitance value C34 of the fifth capacitance 34 is compared to the capacitance value C22 of the second capacitance 22.

In the scenario illustrated in FIG. 9 the output voltage $V_{HB}$ increases at time $t4_2$, with the electrical potentials $V_{N1}$, $V_{N2}$ at the first and second circuit nodes increasing in a corresponding manner. In this connection $t5_2$, $t6_2$ denote times at which the first and second electrical potentials $V_{N1}$, $V_{N2}$ each reach the value of the second reference potential $V_{Ref}$. A time difference $\Delta t_2$ between these times $t5_2$, $t6_2$ is here a direct measure for the temporal change of the output voltage $V_{HB}$. In the steady-state these time differences $\Delta t_1$, $\Delta t_2$, that are determined for the positive and the negative half-cycle of the output voltage $V_{HB}$, are identical, provided that the recharging times during the positive and the negative half-cycles are also identical, which is usually the case in lamp ballasts and LLC converters.

In connection with the explanation that has been given with reference to FIG. 9 it has been assumed that the time periods during which one of the switching pairs of the bridge circuit is switched on, and during which the first switch 32 connects the third capacitance 33 to the second circuit node N2, are identical. In this connection it should be pointed out that this is only an example. The time periods during which the switches of a switch pair are closed, and the time period during which the first switch 32 connects the fourth capacitance 33 to the second circuit node N2, could also be timely offset to each other, provided that these time periods each lie within the on-period of one of the half-bridge switches.

The drive signals $\Phi 1$-$\Phi 4$ explained in connection with FIGS. 6 and 9 can directly be obtained from the drive signals S1, S2 of the half-bridge switches. In the example explained with reference to FIG. 6 the time period, during which the second drive signal $\Phi 2$ assumes an upper signal level, starts, for example, each time after a delay time after an upper signal level of the first or second drive signal S1, T2. The time period during which the second drive signal $\Phi 2$ assumes an upper signal level is, for example, a given fraction of the overall time period, during which the first and second drive signals S1, S2 each assume an upper signal level. This time period, for example, may be measured during a previous drive cycle, so that the method also works for changing switching frequencies of the two switches 101, 102 of the half-bridge. In the example illustrated in FIG. 6 the upper signal level of the first drive signal $\Phi 1$ starts, whenever the second drive signal $\Phi 2$ assumes a lower signal level. The time period of the upper signal level of the first drive signal $\Phi 1$ ends each time the drive signals S1 and S2, respectively, assume the lower signal levels.

Alternatively the upper signal level of the second drive signal $\Phi 2$ may be generated for a fixed time period, this time period being selected such that it is significantly shorter than the shortest possible on-period of the first and second drive signals S1, S2. This on-period is, for example, 50% or less of the shortest possible on-period.

In the method illustrated with reference to FIG. 9 the drive signal $\Phi 1$ for the first switch 32 is, for example, generated in such a manner that it assumes an on-level after expiration of a delay time after an on-level of the first or second drive signals S1, S2, and that it keeps the on-level for a given time period. This given time period is, for example, a fraction of the overall on-period of the first or second switching signals S1, S2, or a fixed time period. Alternatively this time period may end, when the drive signals S1 and S2, respectively, end. The third and fourth drive signals $\Phi 3$ and $\Phi 4$ are generated such, that $\Phi 3$ equals the second drive signal $\Phi 2$ during an on-level of the first switching signal S1, and that $\Phi 4$ equals the second drive signal $\Phi 2$ during an on-level of the second drive signal S2.

In connection with FIGS. 6 and 9 it should be mentioned that these figures are simplified illustrations, because the charging and discharging processes of the capacitances are illustrated by linear waveforms instead of the correct exponential waveforms.

In the circuit arrangements illustrated with reference to FIGS. 5 and 8 the first and second circuit nodes N1, N2 are coupled to the output 103 in such a manner that with a change of the output voltage $V_{HB}$ the potentials $V_{N1}$, $V_{N2}$ at these two nodes N1, N2 change in an identical manner. A time difference $\Delta t$ is here reached due to the fact that the differences $V_{N1}-V_{Ref}$, $V_{N2}-V_{Ref}$ that settle in prior to edges of the output voltage $V_{HB}$, are different from each other. Different from this the nodes N1, N2 could also be coupled to the output 103 in such a manner that the potentials $V_{N1}$, $V_{N2}$ at these nodes N1, N2 each change in a different manner. The differences $V_{N1}-V_{Ref}$, $V_{N2}-V_{Ref}$ could than be set to identical values or to different values before the edges of the output voltage $V_{HB}$, as long as it is assured that these differences are proportional to the amplitude of the output voltage, and that the changes with time of the potentials $V_{N1}$, $V_{N2}$ at the first and second nodes N1, N2 are proportional to the changes with time of the output voltages $V_{HB}$.

Figure 10:
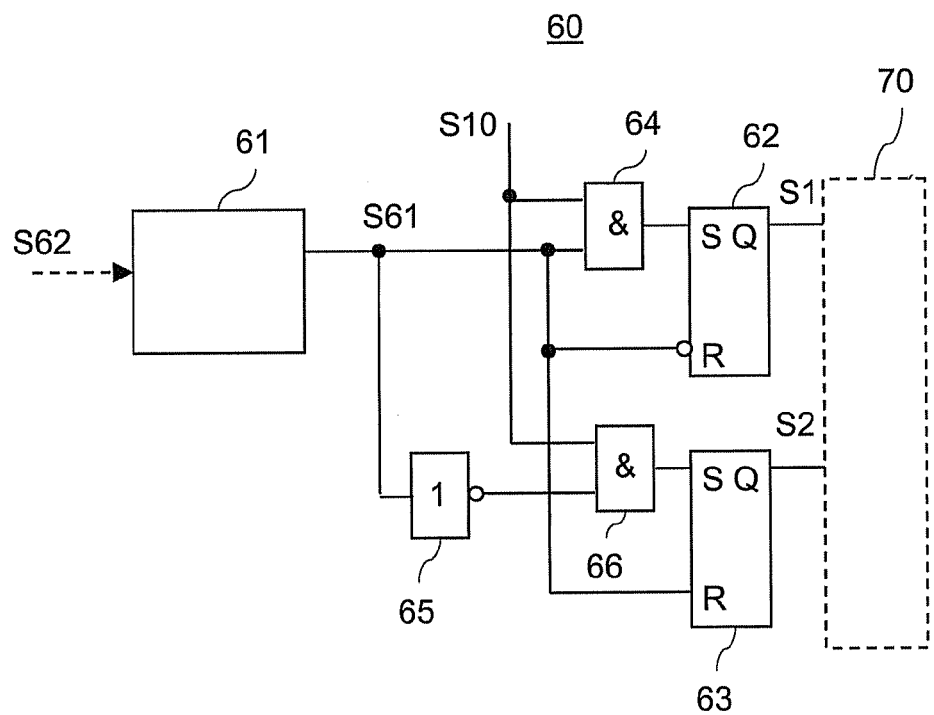
FIG. 10 illustrates an example of a drive circuit for a half-bridge.

A capacitive coupling of the first and second circuit nodes N1, N2 to the output 103, that effects changes with time of the potentials $V_{N1}$, $V_{N2}$, may be obtained in the circuits according to FIGS. 5 and 8 in that, for example, the capacitive divider ratios are different for the first and second nodes N1, N2. For this a capacitive voltage divider 21, 22 could be expanded by adding a further voltage divider capacitance connected in series. The voltage divider obtained through this has two taps, one of which forming the first node N1, and the other one forming the second node N2. Alternatively the third capacitance 23 could be supplemented to a capacitive voltage divider by a further capacitor to be connected between node N2 and a reference potential. An example of a drive circuit 60 for generating the first and second drive signals, S1, S2 for the two half-bridge switches 101, 102 is illustrated in FIG. 10. This drive circuit includes an oscillator 61 that is adapted to generate a rectangular oscillator signal S61. The frequency of this oscillator signal may, for example, be adjusted by a control signal S62 (illustrated in dashed lines) provided to the oscillator 61. The drive circuit further includes a first and a second flip-flop 62, 63, each having a set input S, a reset input R, and an output Q. The first drive signal S1 is available at output Q of the first flip-flop 62, and the second drive signal S2 is available at output Q of the second flip-flop 63. It is assumed for the purpose of the present explanation that the drive signals S1, S2 each assume an on-level, when the corresponding flip-flop 62, 63 is set, and assumes an of-level, when the corresponding flip-flop 62, 63 is reset.

In the drive circuit 60 that is illustrated the two flip-flops 62, 63 are set dependent on the oscillator signal S61 and the dead time signal S10, and are reset dependent on the oscillator signal S61. The first flip-flop 62 is set each time the oscillator signal 61 assumes an upper signal level and the dead time signal S10 signals an end of the dead time. The end of the dead time is, for example, signaled by a rising edge of the dead time signal S10. For this the set input 62 of the first Flip-Flop 62 receives the oscillator signal S61 and the dead time signal S10 via an AND-gate 64. Flip-flop 62 is reset with each falling edge of the oscillator signal S61. For this reset input 62 of the first flip-flop is an inverting input. The second flip-flop 63 is set each time the oscillator signal S61 assumes a lower signal level, and the dead time signal S10 signals an end of the dead time. In the example illustrated the set input S of the second flip-flop 63 receives the inverted oscillator S61—inverted by an inverter 64, and the dead time signal S10 that are AND-gated by a second AND gate 66. The second flip-Flop f3 is reset with each rising edge of the oscillator signal 61. For this the oscillator signal S 61 is directly fed to the reset input R of the second Flip-Flop 63.

Figure 11:
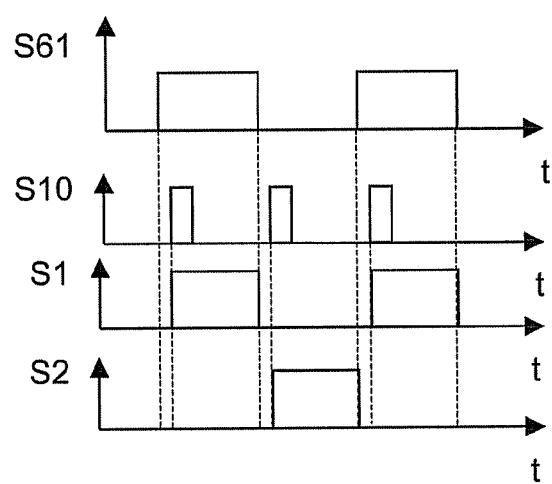
FIG. 11 illustrates the operating principle of the drive circuit according to FIG. 10 by way of signal timing diagrams.
Figure 12:
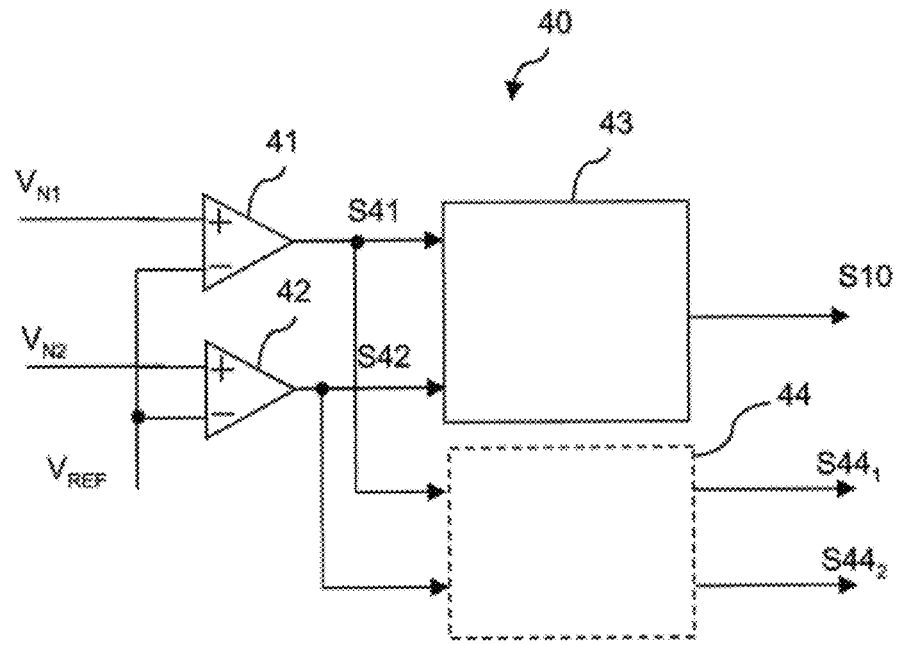
FIG. 12 illustrates a block diagram of an example of the comparator arrangement having two comparators and an evaluation circuit.

The operating principle of the drive circuit 60 illustrated in FIG. 10 becomes apparent by way of FIG. 11, in which exemplary timing diagrams of the oscillator signal 61, the dead time signal S10, as well as the first and second drive signals S1, S2 are illustrated. As it can be seen from FIG. 11 the first drive signal S1 assumes an on-level after expiration of a dead time after a rising edge of the oscillator signal S61, the on-level lasting till the falling edge of the oscillator signal S61. The second drive signal S2 assumes an on-level each time after expiration of the dead time after a falling edge of the oscillator signal S61, the on-level lasting till the next rising edge of the oscillator signal S61. The dead time is determined by the dead time signal S10 and, more exactly, by a rising edge of the dead time signal S10 in the example illustrated.

An example of a dead time signal generation circuit 40 for generating the dead time signal S10 is illustrated in FIG. 10. This circuit arrangement includes two comparators: A first comparator 41 that receives the first potential $V_{N1}$ and the reference potential $V_{REF}$, and that generates a first comparator signal S41 dependent on a comparison of these two potentials; and a second comparator 42 that receives the second potential $V_{N2}$ and the reference potential $V_{REF}$, and that generates a second comparator signal S42 dependent on a comparison of these two potentials. In the example illustrated the first and second potentials $V_{N1}$, $V_{N2}$ are each provided to the non-inverting inputs of the comparators 41, 42, while the second reference potential $V_{REF}$ is provided to the inverting input of these comparators 41, 42. The provision of these signals to the inverting and none-inverting inputs of the two comparators could also be interchanged. The two comparator signals S41, S42 are provided to an evaluation circuit 42 that generates the dead time signal S10.

Figure 13:
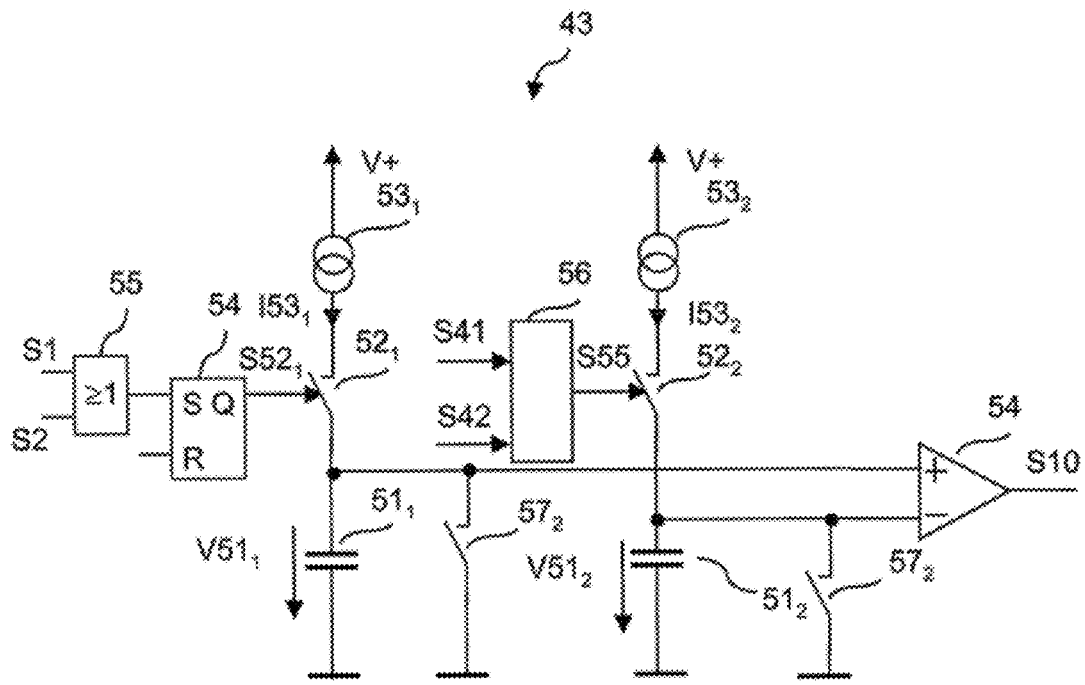
FIG. 13 illustrates an implementation example of the evaluation circuit according to FIG. 12.

An example of the evaluation circle 43 is illustrated in FIG. 13. This evaluation circuit is adapted to determine the dead time after a falling edge of the first or second drive signals S1, S2 from the time difference At, this time difference At being represented by the two comparator for signals S41, S42. In this connection At denotes one of the two time differences $\Delta t_1$, $\Delta t_2$ explained before with reference to FIGS. 6 and 9 that are identical in the steady-state.

The evaluation circuit 43 that is illustrated includes two series circuit each having a capacitance $51_1$, $51_2$, a switching element $52_1$, $52_2$, and a current source $53_1$, $53_2$. The evaluation circuit further includes a comparator 54 that is adapted to evaluate electrical voltages across the capacitances $51_1$, $51_2$, and to generate the dead time signal S10 dependent on a comparison of these voltages $V51_1$, $V51_2$. The first and the second series circuits are adapted to one another in such a manner that the voltage $V51_1$ across capacitance $51_1$ of the first serious circuit with closed switch $52_1$ increases slower than the voltage $V51_2$ across capacitance $51_2$ of the second serious circuit with closed switch $52_2$. This can be obtained by suitably choosing the capacitance values of these capacitances $51_1$, $51_2$ and suitably choosing the current sources $53_1$, $53_2$, where for changes with time $dV51_1/dt$ and $dV51_2/dt$, respectively, of the voltages $V51_1$ and $V51_2$, respectively, across the capacitances $51_1$, $51_2$ it applies:

$$\frac{dV51_1}{dt} = \frac{I53_1}{C51_1}. \tag{8a}$$

$$\frac{dV51_2}{dt} = \frac{I53_2}{C51_2}. \tag{8b}$$

In this connection $I53_1$ and $I53_2$, respectively, denote the currents provided by the current sources $53_1$, $53_2$, and $C51_1$, $C51_2$ denote the capacitance values of the capacitance $51_1$, $51_2$.

Figure 14:
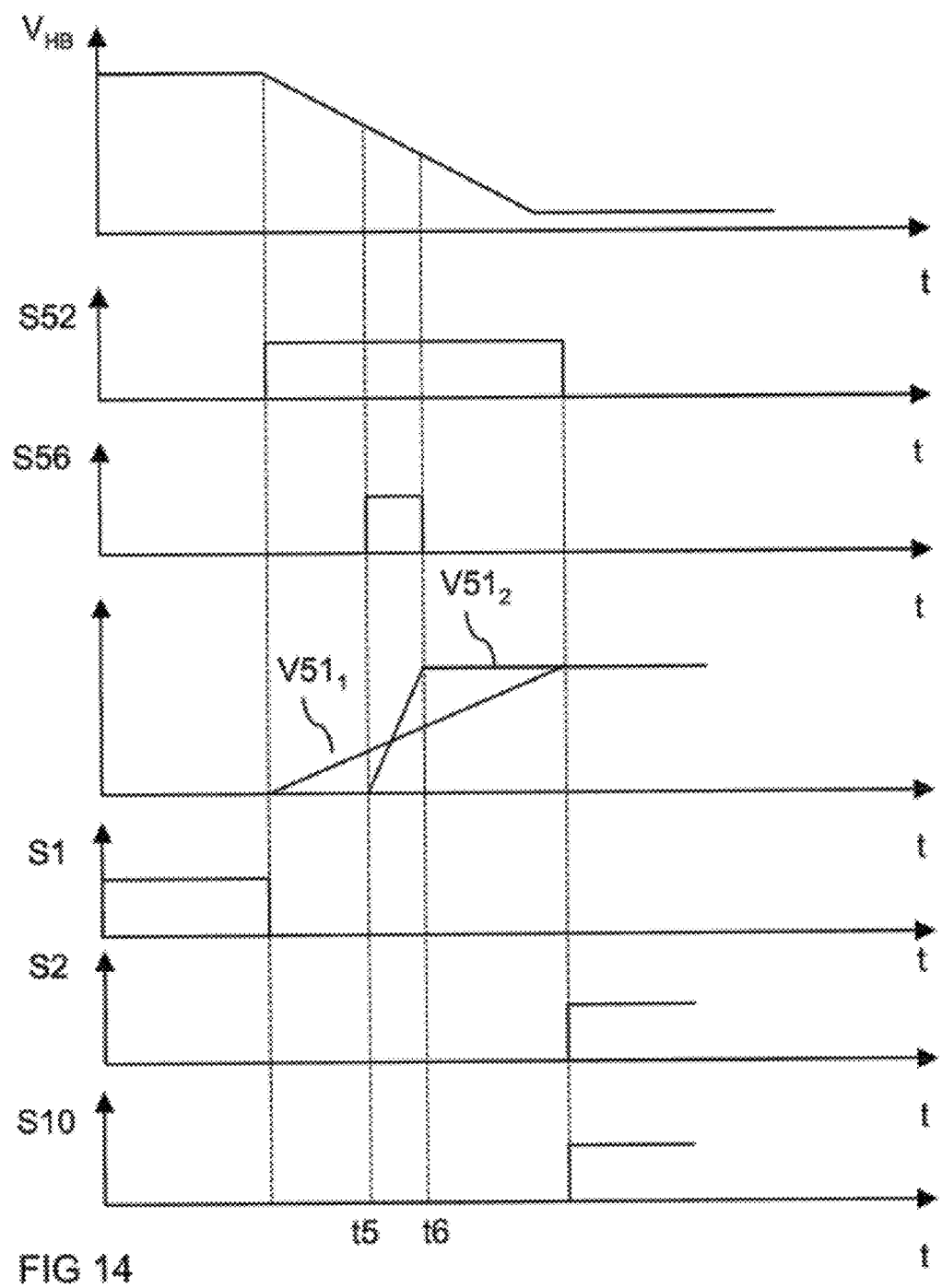
FIG. 14 illustrates the operating principle of the evaluation circuit according to FIG. 13 by way of signal timing diagrams.

The operating principle of the evaluation circuit illustrated in FIG. 13 becomes apparent by way of FIG. 14, in which timing diagrams of some of the signals occurring in the evaluation circuit 43 are illustrated.

Switches $52_1$, $52_2$ of the two series circuits are driven by drive signals $S52_1$, $S52_2$. In the evaluation circuit that is illustrated switched $52_1$ of the first series circuit is switched on with each falling edge of the first or second drive signals S1, S2. For this, drive signal $S52_1$, is, for example generated using a flip-flop 54 having an inverting input S that receives from an OR gate 55 a signal obtained by OR gating the first and second drive signals with S1, S2. Referring to FIG. 14 the voltage $V51_1$ across the first capacitance $51_1$ continuously increases from the falling edge of the first or second drive signals S1, S2, this increase over time being determined by equation (8a).

Switch $52_2$ of the second series circuit is switched on only during time period $\Delta t$, in order to charge the capacitance $51_2$ of the second series circuit. The drive signal $S52_2$ for this switch $52_2$ is, for example, generated from the first and second comparator signals S41, S42 by an XOR gate 56.

The dead time $T_D$ starts with the falling edge of the first or second drive signals S1, S2, and ends when the voltage $V51_1$ across the capacitance $51_1$ has increased to the value of the voltage $V51_2$ across faster charged capacitance $51_2$. After reaching the dead time $T_D$ the capacitances $51_1$, $51_2$ are discharged via switches $57_1$, $57_2$ connected in parallel. These switches $57_1$, $57_2$ are, for example, driven by drive signals (not illustrated) that may correspond to the first or second drive signals $\Phi 1$ or $\Phi 2$.

The dead time $T_D$ that is determined using the explained dead time signal generation circuit, is directly proportional to the time difference $\Delta t$, that is given by the two comparator signals S41, S42. For this dead time $T_D$ it applies, independent of the time difference $\Delta t$:

$$T_D = \frac{I53_2}{C53_2} \cdot \frac{C53_1}{I53_1} \cdot \Delta t. \qquad (9)$$

Thus, dead time $T_D$ besides the time difference is only dependent on the dimensioning of the two series circuits.

It should be mentioned that in FIG. 14 determining the dead time is illustrated for the time period of a falling edge of the output voltage $V_{HB}$, i.e., for the time period after a falling edge of the first drive signal S1. Determining the dead time for the time period during a rising edge of the output voltage $V_{HB}$, i.e., after a falling edge of the second drive signal S2 works, of course, correspondingly.

Optionally the evaluation circuit 40 includes a further evaluation unit 44 that is adapted to determine if the zero crossings of the first and second potentials $V_{N1}$, $V_{N2}$ occur within a given time period after beginning of an edge of the output voltage $V_{HB}$, i.e., after a falling edge of the first or second drive signals S1, S2. For this the evaluation unit 44 receives the first and the second comparator signals S41, S42 and a further signal, the further signal indicating falling edges of the first and second drive signals S1, S2. This further signal is, for example, signal $S52_1$ according to FIG. 13.

The evaluation unit 44 is adapted to generate two error signals $S44_1$, $S44_2$: The first error signal $S44_1$ represents a first error scenario for which the two zero crossings, i.e., the zero crossing of the first and the second potential $V_{N1}$, $V_{N2}$ do not occur. In this case there is a hard commutation of the half-bridge, i.e., a reactive component of the output current flows in the wrong direction. In this case the half-bridge should be switched-off after a short delay time that is in the range of some switching cycles. The second error signal $S44_2$ represents a second error scenario for which only the second zero crossing i.e., the zero crossing of the first potential $V_{N1}$ does not occur. In this case a non-zero-voltage-switching-operation may occur. In this case the half-bridge should also be switched off, because in such a non-zero-voltage-switching-operation increased power losses occur. The time period between detecting such an error scenario and switching off the half-bridge may, however, be longer than the time period between detecting a hard commutation and switching off, and may amount several seconds or several 10.000 switching cycles.

Instead of generating the first and second error signals $S44_1$, $S44_2$ using the first and second comparator signals S41, S42, there is also the possibility of evaluating the voltages $V51_1$, $V51_2$ in the evaluation circuit 43 according to FIG. 13. There is, for example, the first error scenario if the slowly increasing voltage $V51_1$ rises above a first upper threshold value, and there is, for example, the second error scenario, if the faster increasing voltage $V51_2$ rises above a second upper threshold value. These threshold values may be different, but could also be made identical.

Figure 15:
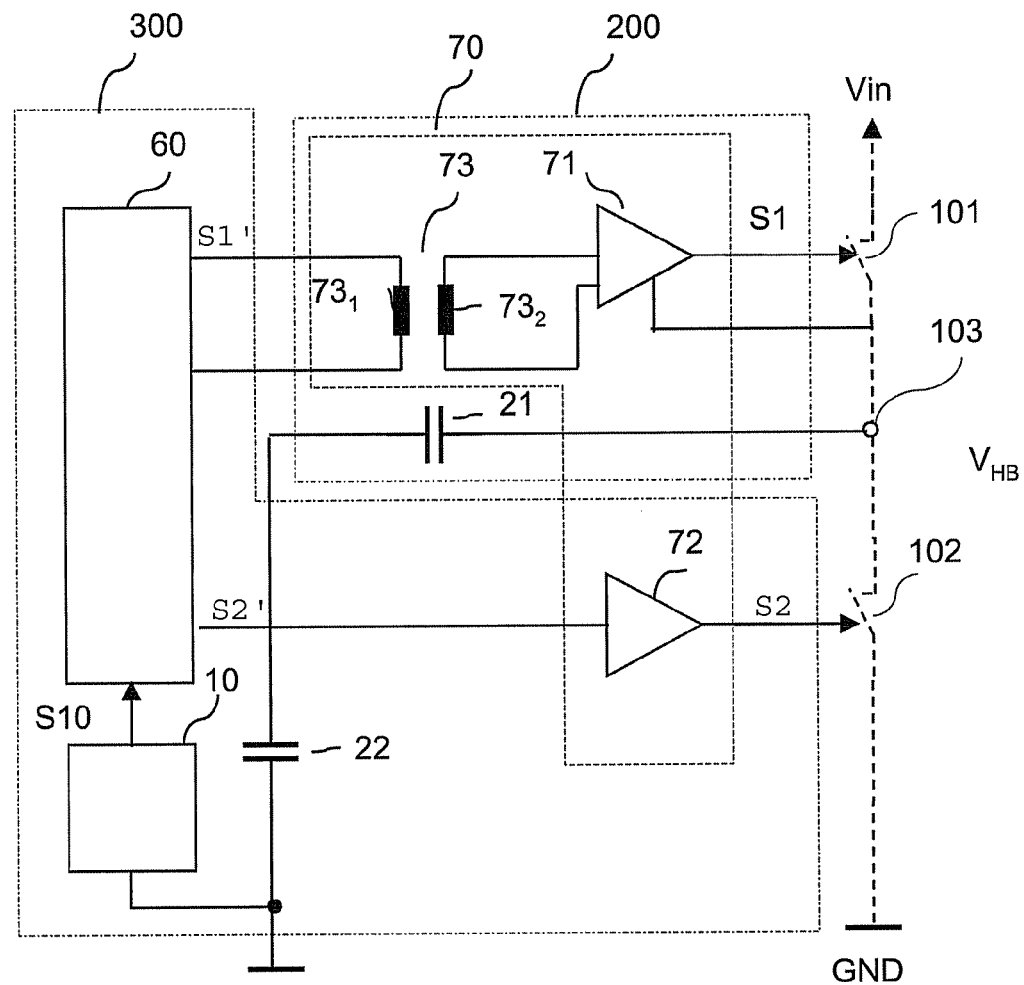
FIG. 15 illustrates, by way of a block diagram, an example of a control circuit for the half-bridge, the control circuit including a circuit arrangement for determining a variation of an output voltage of the half-bridge with time, and a transformer in the control path of one of the switching elements of the half-bridge.

First and second drive signals S1, S2 as they are generated by the drive circuit according to FIG. 10, are not directly suitable for driving the half-bridge switches 101, 102, namely not in those cases, in which the input voltage Vin is larger than the signal change of the control signal S1, S2. In this case a driver circuit 70 is required between the drive circuit 60 and the half-bridge switches 101, 102, that are, for example, power MOSFET, driver circuit 70 being suitable for transferring the drive signals S1, S2 generated by drive circuit 60 into suitable signals that are suitable for driving the half-bridge switches 101, 102. An example of such driver circuit 70 is illustrated in FIG. 15. For a better understanding the half-bridge, the switches of which are n-channel MOSFET in the example illustrated, is also illustrated in FIG. 15. Driver circuit 70 includes two driver stages 71, 72: A first driver stage 71 that generates the drive signal S1 for the high-side switch 101, and a second driver stage 72 that generates the drive signal S2 for the low-side switch 102. The drive signal for the second switch 102 generated by the drive circuit 60, and being denoted with S2' in FIG. 15, is directly provided to the second driver stage 72.

For driving the high-side switch a drive signal S1 is required that is related to the electrical potential at the output 102 of the half-bridge, and that for switching on an n-MOSFET needs to be higher than the upper supply potential Vin. This drive signal S1 is generated by the first driver stage 71 which for this is, for example, connected with the output 103 and that, for example, includes a bootstrap circuit or a charge pump (not illustrated). For transmitting the drive signal S1' of the first semiconductor switch 101 generated by the drive circuit 60 to the first driver stage 61 a transformer 73 having a primary winding $73_1$ and a secondary winding $73_2$ is present. Transformer 73 transmits the drive signal S1', that is, for example, related to the further reference potential or reference potential GND, respectively, to the first driver stage 11, first driver stage 11 receiving the potential at the output 103 of the half-bridge as a reference potential, for example. A drive signal S1' that is, for example, rectangular is changed in its waveform when transmitting it via transformer 73, so that in the first driver circuit 73 demodulation circuit may be present in a manner not illustrated in detail, these demodulation circuits being suitable for transferring the signals received at the secondary side of the transformer 73 in suitable drive signals for driving the first half-bridge switch 101. Such demodulation circuits are commonly known, so that no further explanations are required in this regard.

Transformer 73 is, for example, a air-cored transformer or transformer without transformer core (coreless transformer). Such transformer does not have a transformer core and can therefore be integrated in or on an integrated circuit easily.

Figure 16:
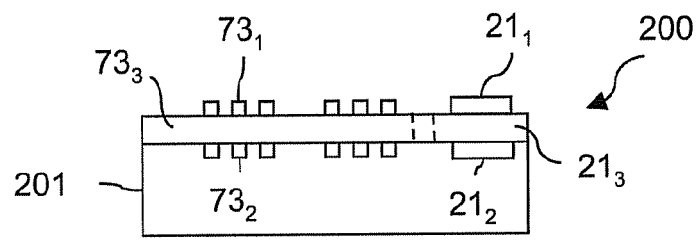
FIG. 16 schematically illustrates an example for implementing the transformer.

FIG. 16 by way of a cross section through a semiconductor body 200 illustrates a possible realization of an air-cored transformer 73. The primary winding $73_1$ and the secondary winding $73_2$ of this transformer 73 are dielectrically insulated from one another by a transformer dielectric $73_3$. One of the windings, in the example the secondary winding $73_2$, is, for example, arranged at the semiconductor substrate 201 below the dielectric $73_3$ while the second winding is arranged above the transformer dielectric $73_3$. In a manner not illustrated in detail additional circuit components of the driver circuit 70 or of the drive circuit 60 may be integrated in the semiconductor substrate 201.

The input voltage Vin of the half-bridge may amount up to several 100V dependent on the kind of load to be driven by the half-bridge. Drive circuit 60 and dead time signal generation circuit 10 are, however, for example logic circuits having a supply voltage or a voltage blocking capability, respectively, of only some volts. The voltage across the second capacitance 22 of the capacitive voltage divider should therefore not be higher than the voltage blocking capability of these logic circuits, so that across the first capacitance 21 of this voltage divider the major part of the input voltage Vin drops. This first capacitance 21 of the capacitance voltage divider that is also illustrated in FIG. 15 should therefore have a sufficient voltage blocking capability. This is, for example, achieved by using as the capacitance dielectric the same dielectric as the transformer dielectric 73, or that as the dielectric for the first capacitance 21 a dielectric is used that is separated from the transformer dielectric 73, but that has been produced using the same process steps as the transformer dielectric 73.

For a better understanding the first capacitance 21 of the capacitive voltage divider is also illustrated in FIG. 16. This first capacitance 21 is realized as a plate capacitor in the example illustrated, the capacitor having two capacitor plates $21_1$, $21_2$ that are separated from one another by dielectric $21_3$. Dielectric $21_3$ and the transformer dielectric $73_3$ may be realized as a continuous dielectric layer, but may also be separated form one another (illustrated in dash lines). The dielectrics $73_3$, $21_3$ are, for example, comprised of an imide or an oxide.

The overall drive circuit illustrated in FIG. 15, having the drive circuit 60, the dead time signal generation circuit 10, the capacitive voltage divider 21, 22 and driver circuit 70, may be integrated in two different semiconductor chips or semiconductor bodies, respectively, that are illustrated in dash-dotted lines in FIG. 15 and that have reference number 200 and 300. In the example illustrated first driver stage 71, transformer 73, and the first capacitor 71 of the capacitive voltage divider are integrated in the first semiconductor body 200, while the second driver stage 72, the drive circuit 60, the dead time signal generation circuit 10 as well as the second capacitor 72 are integrated in the second semiconductor body 300. In a manner not illustrated in detail it is also possible to integrate all components except for the first driver stage 71 in the second semiconductor body 100 and to only integrate the first driver stage 71 in the first semiconductor body 200.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A circuit arrangement for determining a change with time of an output voltage of a half-bridge circuit during a dead time, the half-bridge circuit comprising two switching elements that alternatingly assume an on-state and an off-state and that both assume an off-state during the dead time, the circuit arrangement comprising:

a first input for applying the output voltage;
a capacitive network having a first and a second circuit node each being capacitively coupled to the input, and having a terminal for a reference potential;
a recharging circuit for the capacitive network that is configured, during the switched-on phase of one of the first and second switching elements, to adjust electrical potentials of the first and second nodes, the electrical potentials each being different from the reference potential; and
a comparator arrangement that is configured during the dead time to determine a time difference between such times at which the electrical potentials at the first and second node each assume a given potential value, this time difference being a measure for the change with time of the output voltage, wherein the capacitive network further comprises:
a third capacitance coupled to the tap of the capacitive voltage divider; the first circuit node being formed by the tap of the voltage divider, and the second circuit node being formed by a terminal of the third capacitance facing away from the tap, wherein the changeover circuit further comprises:
a fourth capacitance, which by the first switch is alternatingly connectable to the second circuit node of the capacitive network, or the terminal for the reference potential; and
a second switch being connected in parallel with the third capacitance of a capacitive network.

2. The circuit arrangement of claim 1, wherein the recharging circuit is configured to
during the switched-on phase of the one switching element of the half-bridge to close the second switch for a time period that is shorter than the switched-on phase, and to subsequently open the second switch,
during the switched-on phase of the one switching element of the half-bridge, and after opening the second switch to connect the third capacitance of the capacitive network to the fourth capacitance of the recharging circuit.

3. A circuit arrangement for determining a change with time of an output voltage of a half-bridge circuit during a dead time, the half-bridge circuit comprising two switching elements that alternatingly assume an on-state and an off-state and that both assume an off-state during the dead time, the circuit arrangement comprising:

a first input for applying the output voltage;
a capacitive network having a first and a second circuit node each being capacitively coupled to the input, and having a terminal for a reference potential;
a recharging circuit for the capacitive network that is configured, during the switched-on phase of one of the first and second switching elements, to adjust electrical potentials of the first and second nodes, the electrical potentials each being different from the reference potential; and
a comparator arrangement that is configured during the dead time to determine a time difference between such times at which the electrical potentials at the first and second node each assume a given potential value, this time difference being a measure for the change with time of the output voltage, wherein the capacitive network further comprises:
a third capacitance coupled to the tap of the capacitive voltage divider; the first circuit node being formed by the tap of the voltage divider, and the second circuit node being formed by a terminal of the third capacitance facing away from the tap, wherein the recharging circuit further comprises:

a fourth capacitance, which by the first switch is alternatingly connectable to the second circuit node of the capacitance network or the terminal for the reference potential; and a bridge circuit having four switching elements and having a fifth capacitance, the bridge circuit being connected between the first circuit node and the terminal for the reference potential.

4. The circuit arrangement of claim 3, wherein the recharging circuit is configured to during the switched-on phase of the one switching element of the half-bridge to connect the third capacitance of the capacitive network to the fourth capacitance of the changeover circuit for a time period being shorter than the switched-on phase;

during the switched-on phase of the one of the switching elements of the half-bridge to connect the fifth capacitance of the bridge circuit between the first circuit node of the capacitive network and the terminal for the reference potential for a time period being shorter than the switched-on phase, namely with a first polarity, if the one of the switching elements is the first switching element, and with a second polarity, if the one of the switching elements is the second switching element.

5. A drive circuit for a half-bridge circuit having a first and a second switching element and having an output, the drive circuit comprising:

a drive signal generation circuit that is adapted to generate a first drive signal for the first switching element and a second drive signal for the second switching element dependent on a dead time signal;

a dead time signal generation circuit, comprising:

an input for applying the output voltage thereto;

a capacitive network having a first and a second circuit node, each being capacitively coupled to the input, and having a terminal for a reference potential;

a recharging circuit for the capacitive network, the recharging circuit being configured to during the switched-on phase of one of the first and second switching elements to adjust electrical potentials at the first and second circuit nodes that are each different from the reference potential;

a comparator arrangement that is configured to during the dead time to determine a time difference between those times at which the electrical potentials at the first and second nodes each assume a given potential value, this time difference being a measure for a change with time of the output voltage, wherein the drive signal generation circuit comprises:

a logic circuit that receives the dead time signal;

a first driver circuit, being coupled to the logic circuit via a transformer, and providing the first drive signal;

a second driver circuit, being connected to the logic circuit, and providing the second drive signal, wherein:

the first driver circuit, the transformer and the first capacitance of the capacitive voltage divider are integrated in a first semiconductor chip;

the logic circuit, the second driver circuit and the second capacitance of the capacitive voltage divider are integrated in a second semiconductor chip.

6. The drive circuit of claim 5, wherein the capacitive network comprises a terminal for a further reference potential.

7. The drive circuit of claim 6, wherein the capacitive network comprises:

a capacitive voltage divider having a first and a second capacitance that are connected in series with each other between the input and the terminal for the further reference potential, and having a tap.

8. The drive circuit of claim 7, wherein the capacitive network further comprises:

a third capacitance being coupled to the tap of the capacitive voltage divider.

9. The drive circuit of claim 5, wherein the transformer is an air-cored transformer having a primary winding and a secondary winding that are separated from one another by a dielectric layer, and wherein the first capacitance comprises a first and a second electrode that are separated from one another by a second dielectric layer.

10. A drive circuit for a half-bridge circuit having a first and a second switching element and having an output, the drive circuit comprising:

a drive signal generation circuit that is adapted to generate a first drive signal for the first switching element and a second drive signal for the second switching element dependent on a dead time signal;

a dead time signal generation circuit, comprising:

an input for applying the output voltage thereto;

a capacitive network having a first and a second circuit node, each being capacitively coupled to the input, and having a terminal for a reference potential;

a recharging circuit for the capacitive network, the recharging circuit being configured to during the switched-on phase of one of the first and second switching elements to adjust electrical potentials at the first and second circuit nodes that are each different from the reference potential;

a comparator arrangement that is configured to during the dead time to determine a time difference between those times at which the electrical potentials at the first and second nodes each assume a given potential value, this time difference being a measure for a change with time of the output voltage, wherein the drive signal generation circuit comprises:

a logic circuit that receives the dead time signal;

a first driver circuit, being coupled to the logic circuit via a transformer, and providing the first drive signal; and a second driver circuit, being connected to the logic circuit, and providing the second drive signal, wherein the first driver circuit is integrated in a first semiconductor chip;

the transformer, the first capacitance of the capacitive voltage divider, the logic circuit, the second driver circuit and the second capacitance of the capacitive voltage divider are integrated in a second semiconductor chip.

11. The drive circuit of claim 10, wherein the transformer is a air-cored transformer having a primary winding and a secondary winding being separated from one another by a first dielectric layer, and wherein a first capacitance comprises a first and a second electrode being separated from one another by a second dielectric layer.

12. The drive circuit of claim 11, wherein the first and the second dielectric layers are formed by a common dielectric layer.

* * * * *